(12) United States Patent
Ohsawa

(10) Patent No.: US 7,388,786 B2
(45) Date of Patent: Jun. 17, 2008

(54) SEMICONDUCTOR STORAGE APPARATUS

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 538 days.

(21) Appl. No.: 11/092,905

(22) Filed: Mar. 30, 2005

(65) Prior Publication Data

US 2007/0242516 A1 Oct. 18, 2007

(30) Foreign Application Priority Data

Aug. 31, 2004 (JP) ............................. 2004-252846

(51) Int. Cl.
*G11C 11/03* (2006.01)
(52) U.S. Cl. .................. 365/185.21; 365/149; 365/150; 365/185.26
(58) Field of Classification Search ............ 365/185.21, 365/149, 150, 185.26
See application file for complete search history.

(56) References Cited

U.S. PATENT DOCUMENTS 7,145,811 B2 12/2006 Ohsawa 7,266,027 B2 * 9/2007 Schneider et al. ........... 365/201
7,269,065 B2 * 9/2007 Miyamoto ............. 365/185.17

* cited by examiner

*Primary Examiner*—Pho M. Luu
(74) *Attorney, Agent, or Firm*—Oblon, Spivak, McClelland, Maier & Neustadt, P.C.

(57) ABSTRACT

A semiconductor storage apparatus including cell arrays, each having a plurality of memory cells connected to a pair of first and second bit lines; and sense amplifiers, each being provided corresponding to the pair of first and second bit lines and sensing data read out from the memory cell to be read out, wherein each of the sense amplifiers includes a current mirror circuit having first and second current paths connected directly or indirectly to the pair of first and second bit lines; and the current mirror circuit includes: a first transistor which has a source and a drain short-circuited to each other and flows a reference current between the source and the drain; and a second transistor, of which gate is commonly connected to a gate of the first transistor, and which flows a current passing through the memory cell to be read out between a source and a drain thereof.

14 Claims, 24 Drawing Sheets

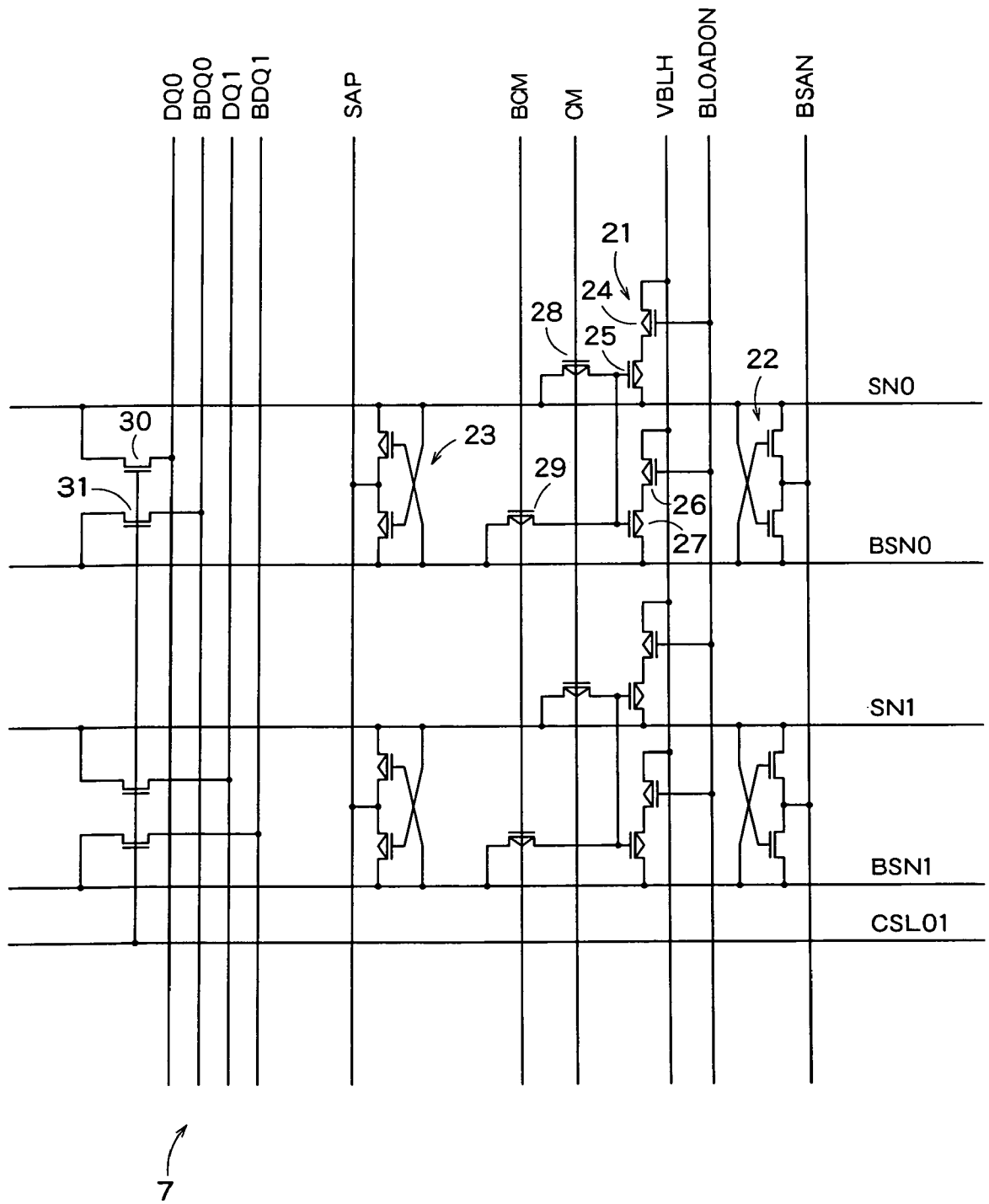
F I G. 3

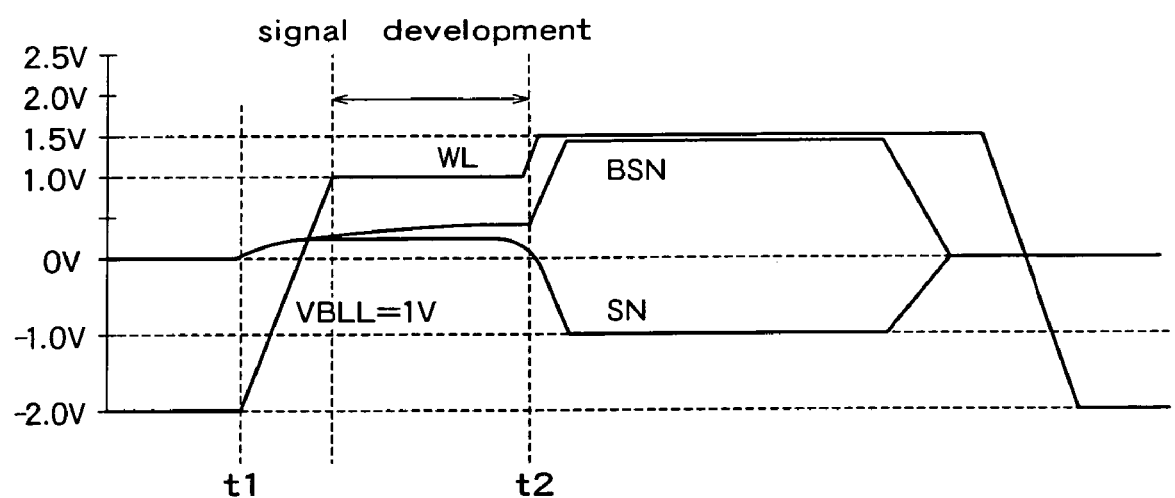
F I G. 5

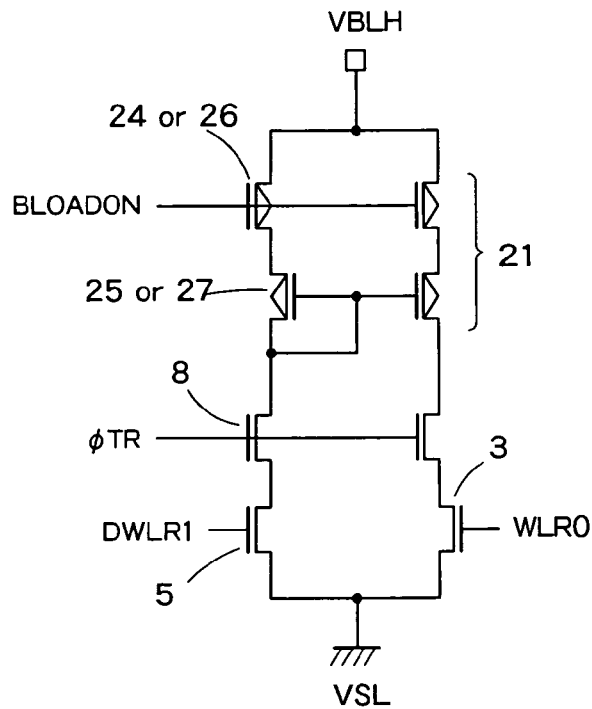
F I G. 7
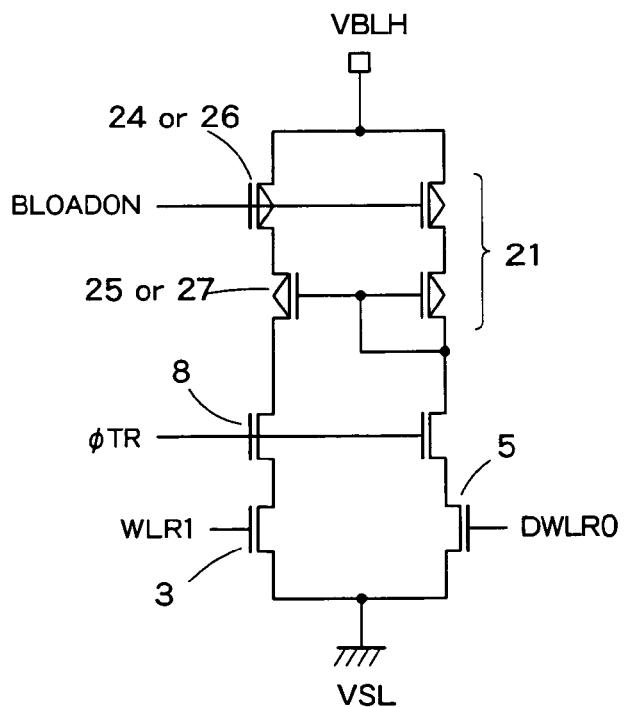
F I G. 8

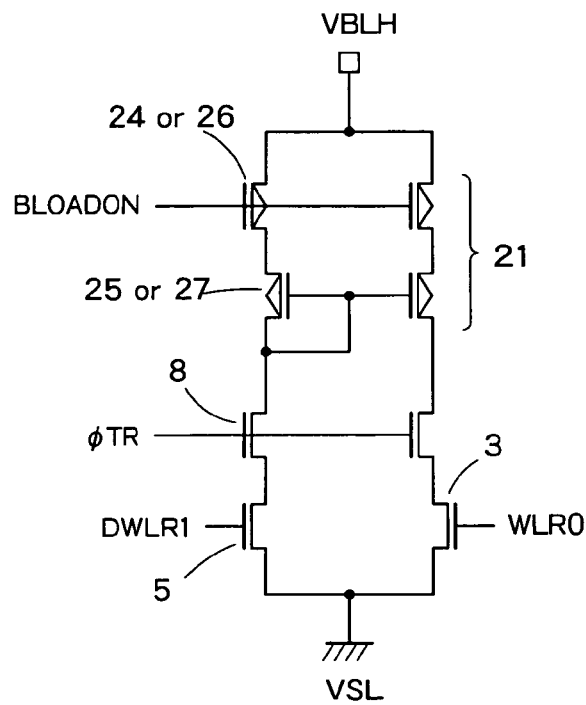
F I G. 10
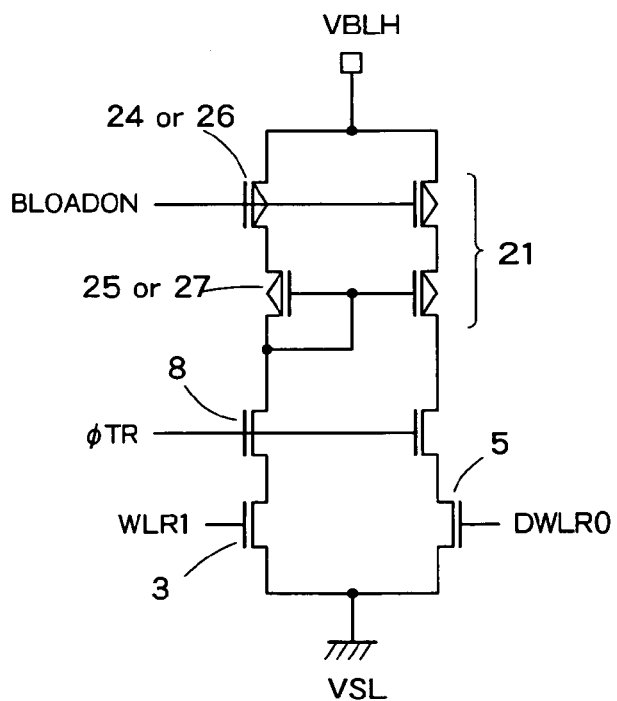
F I G. 11

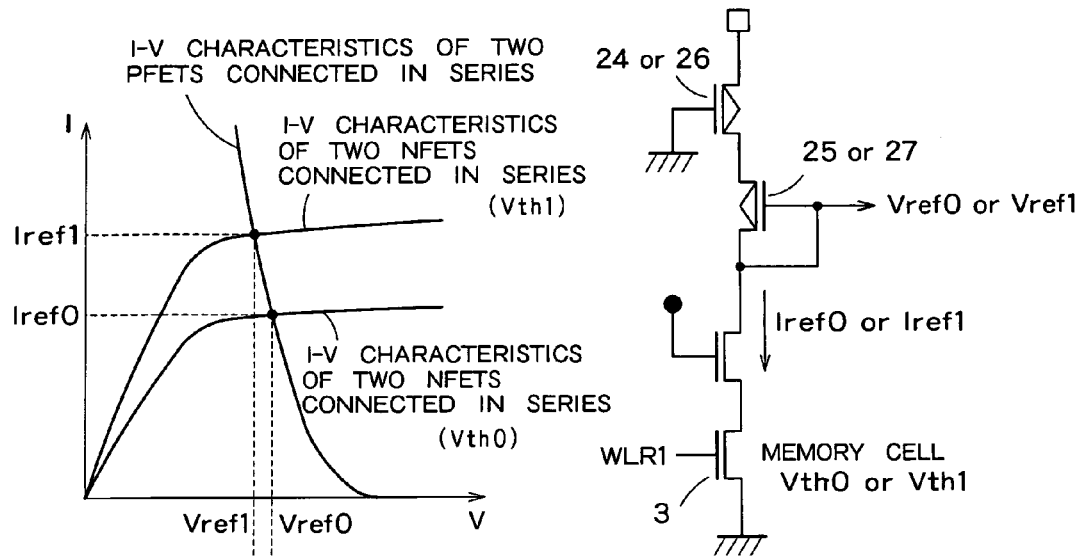
F I G. 12A
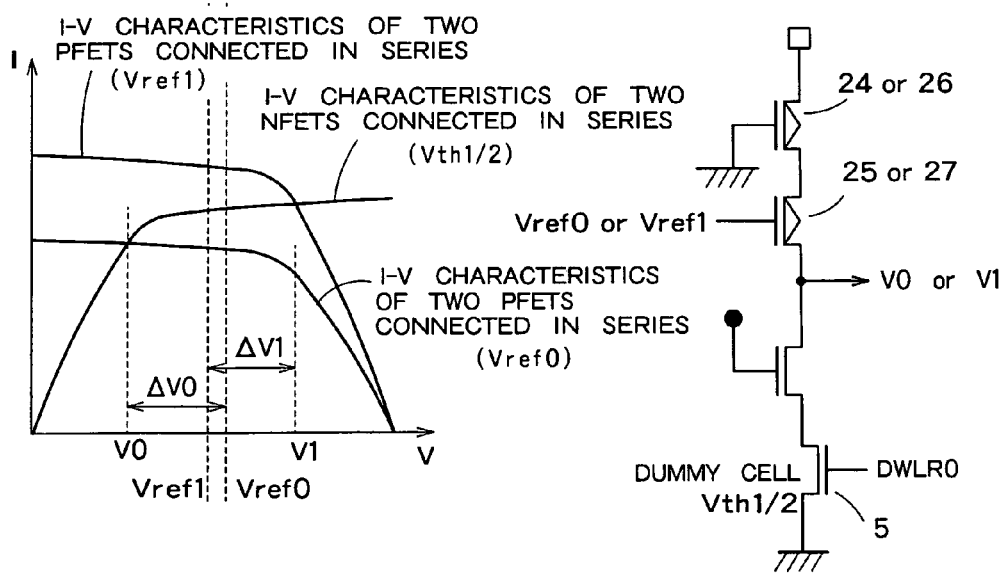
F I G. 12B

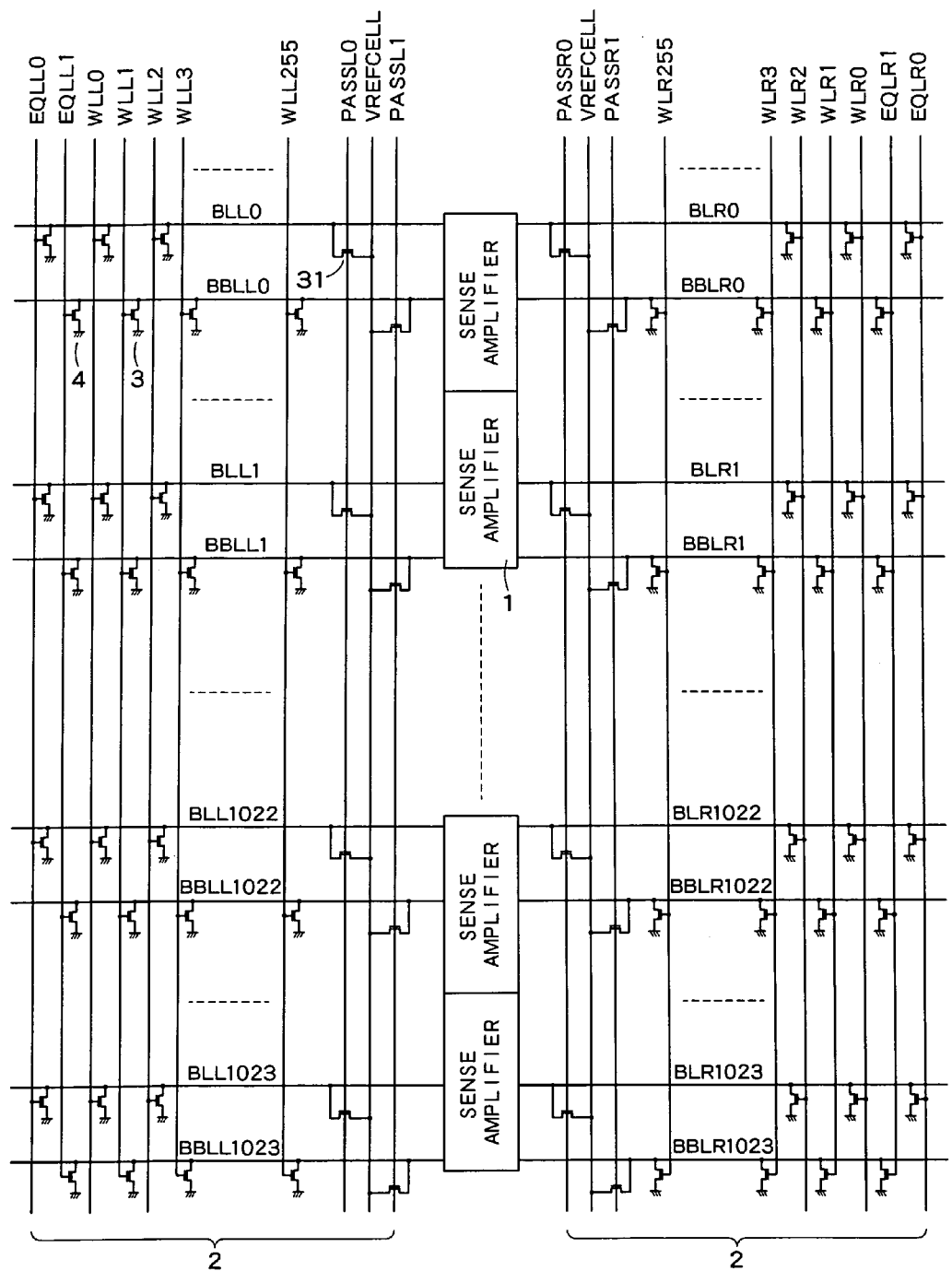
F I G. 13

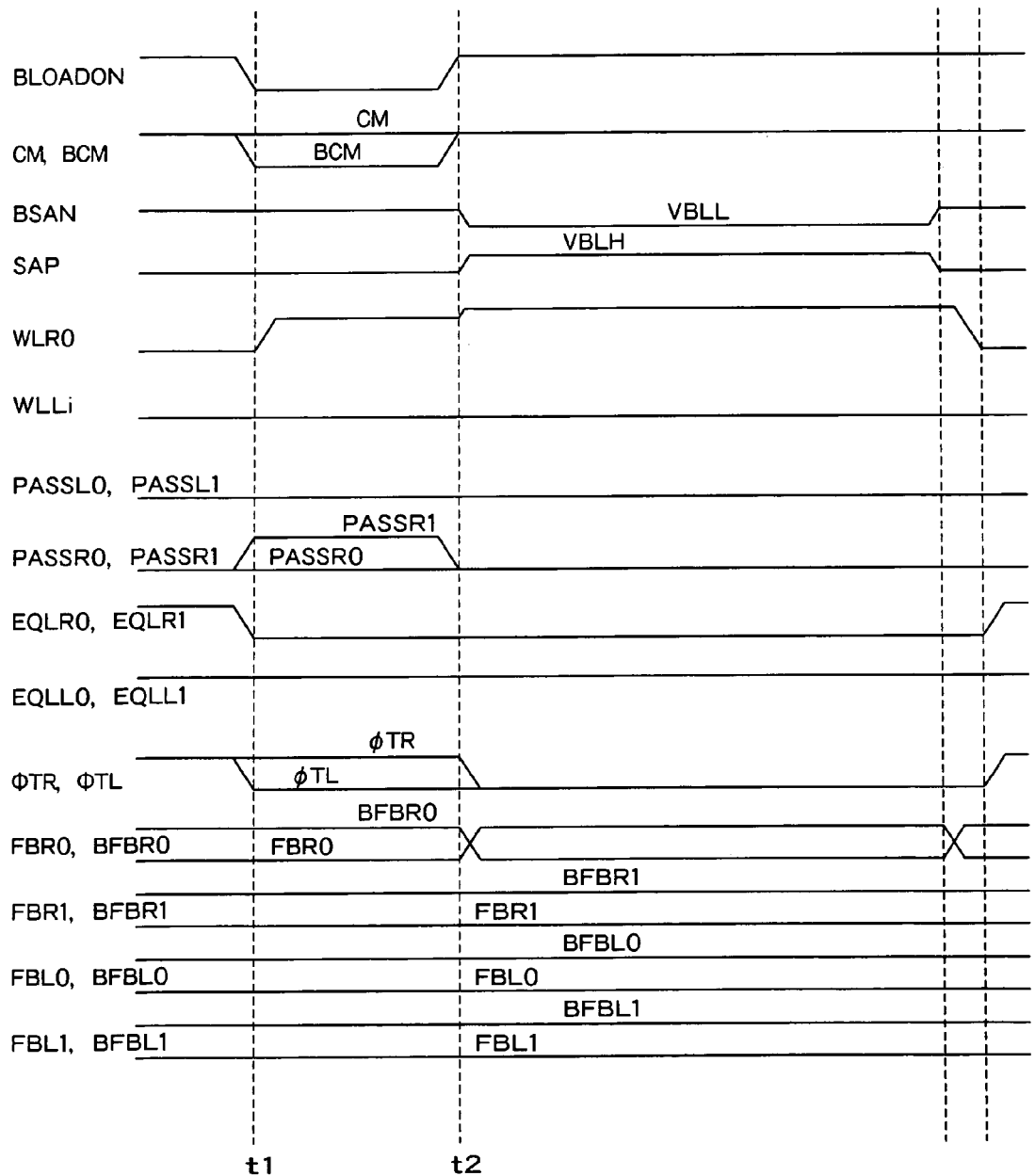
F I G. 16

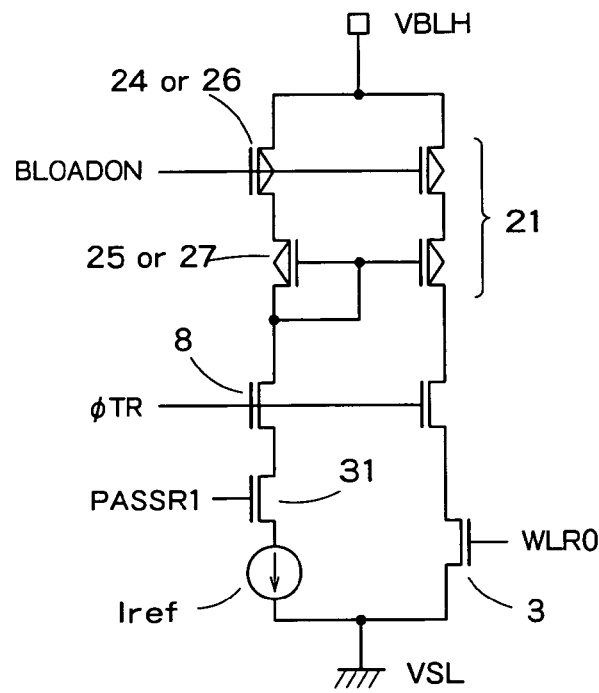
F I G. 17
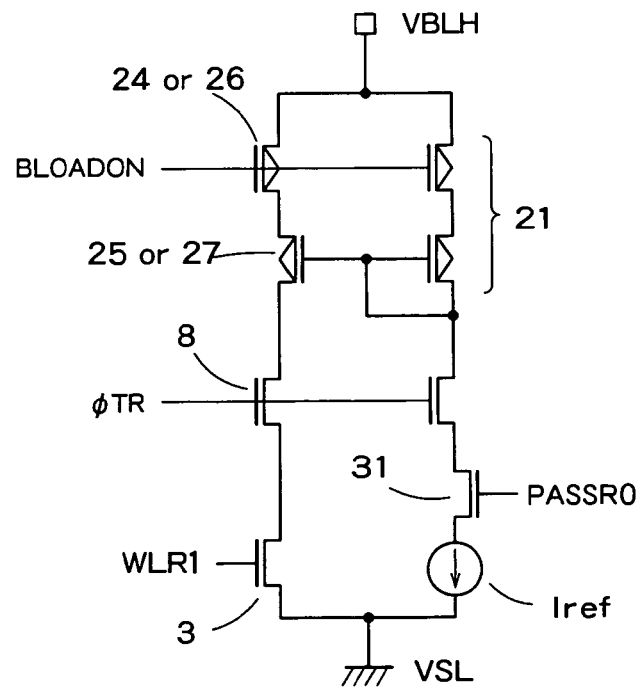
F I G. 18

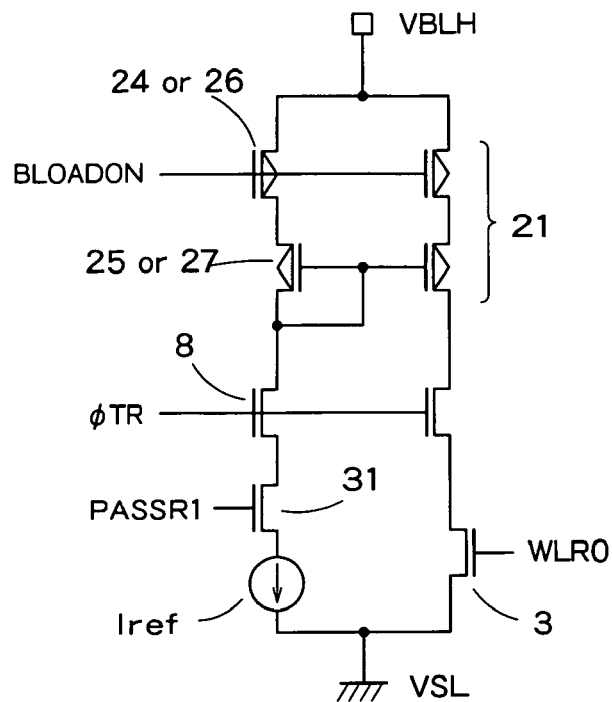
F I G. 19
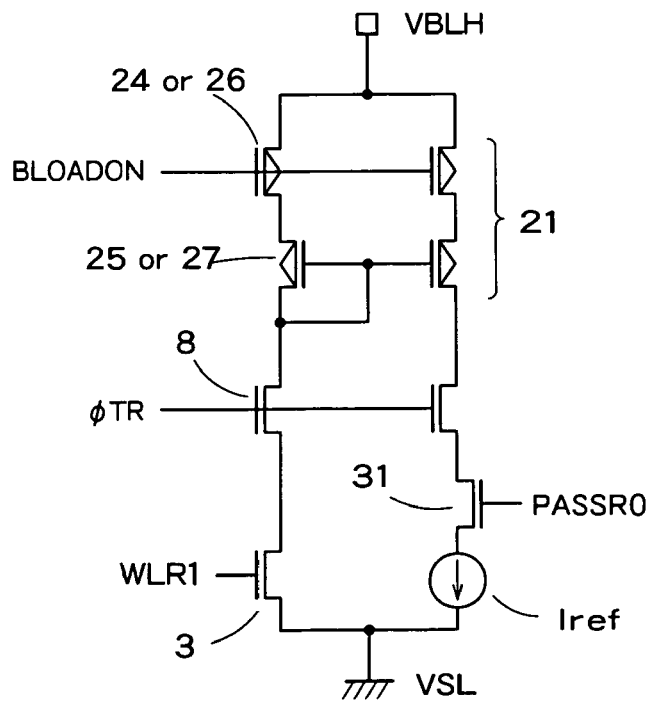
F I G. 20

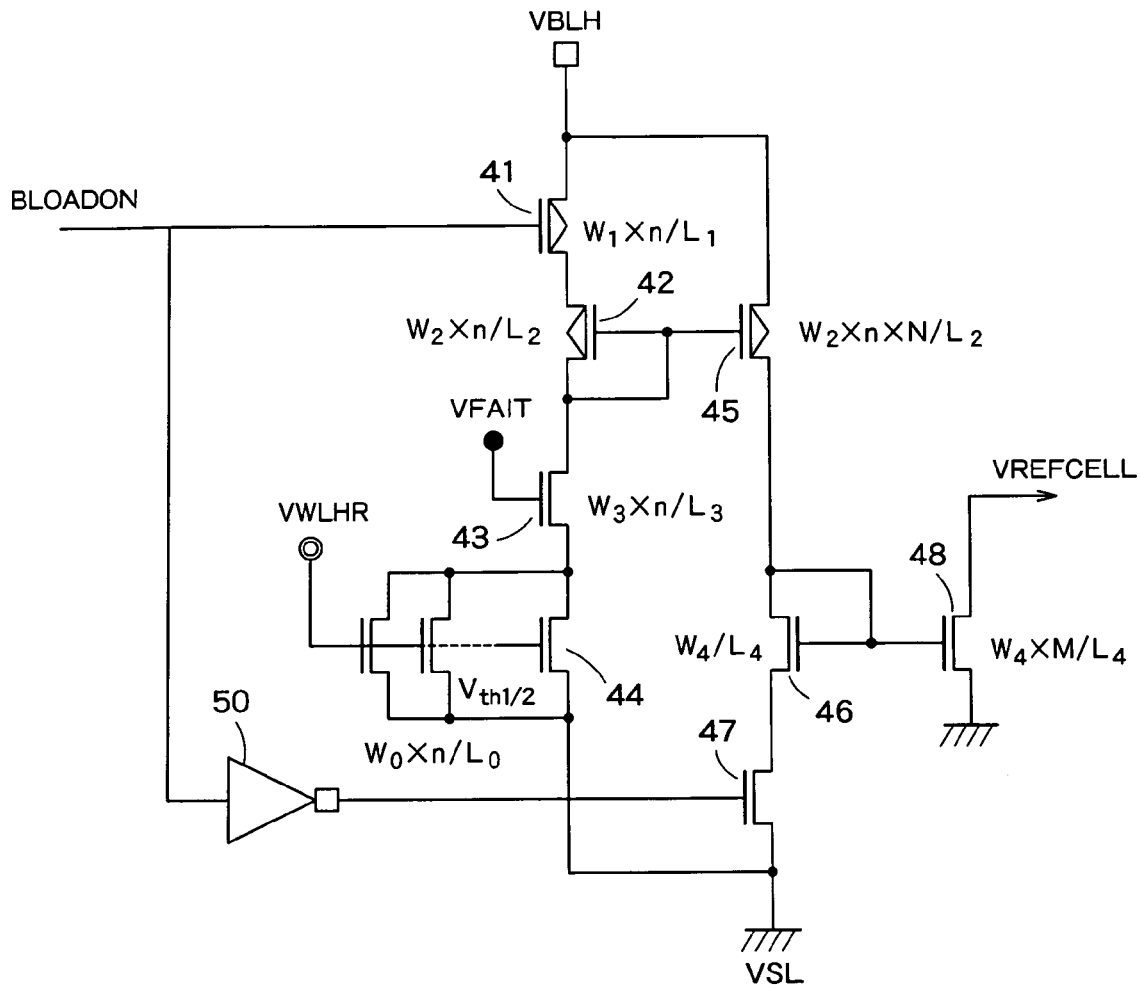
$W_0/L_0$ = CHANNEL WIDTH OF MEMORY CELL /CHANNEL LENGTH
$n \times N \times M$ = THE NUMBER OF SENSE AMPLIFIERS
F I G. 23

$W_0/L_0$ = CHANNEL WIDTH OF MEMORY CELL /CHANNEL LENGTH
n×N×M = THE NUMBER OF SENSE AMPLIFIERS

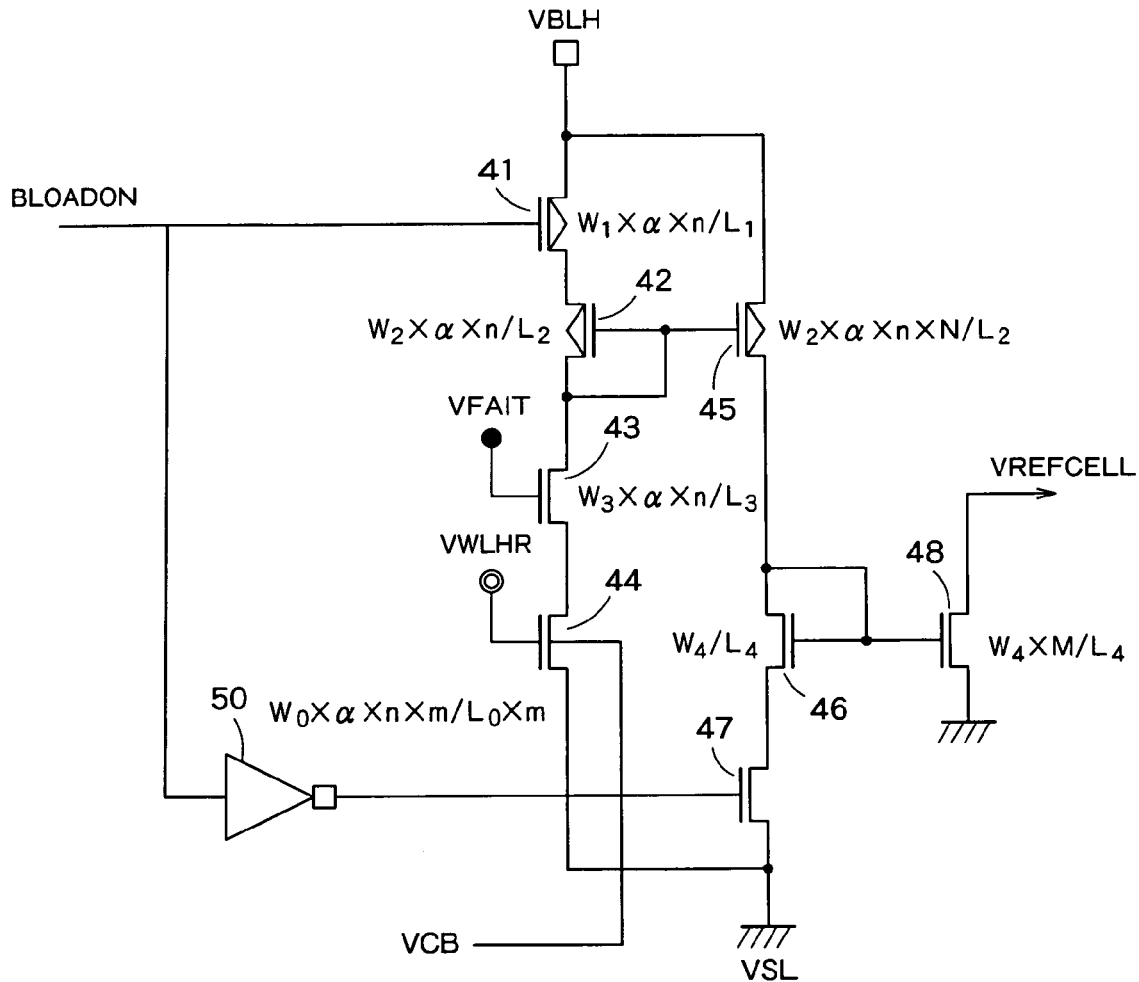
$W_0/L_0$ = CHANNEL WIDTH OF MEMORY CELL/CHANNEL LENGTH
n×N×M = THE NUMBER OF SENSE AMPLIFIERS
$\alpha$ = Ids(PERIPHERAL CIRCUIT TRANSISTOR)/
　　　　Ids(CELL TRANSISTOR)@THE SAME W/L
F I G. 25

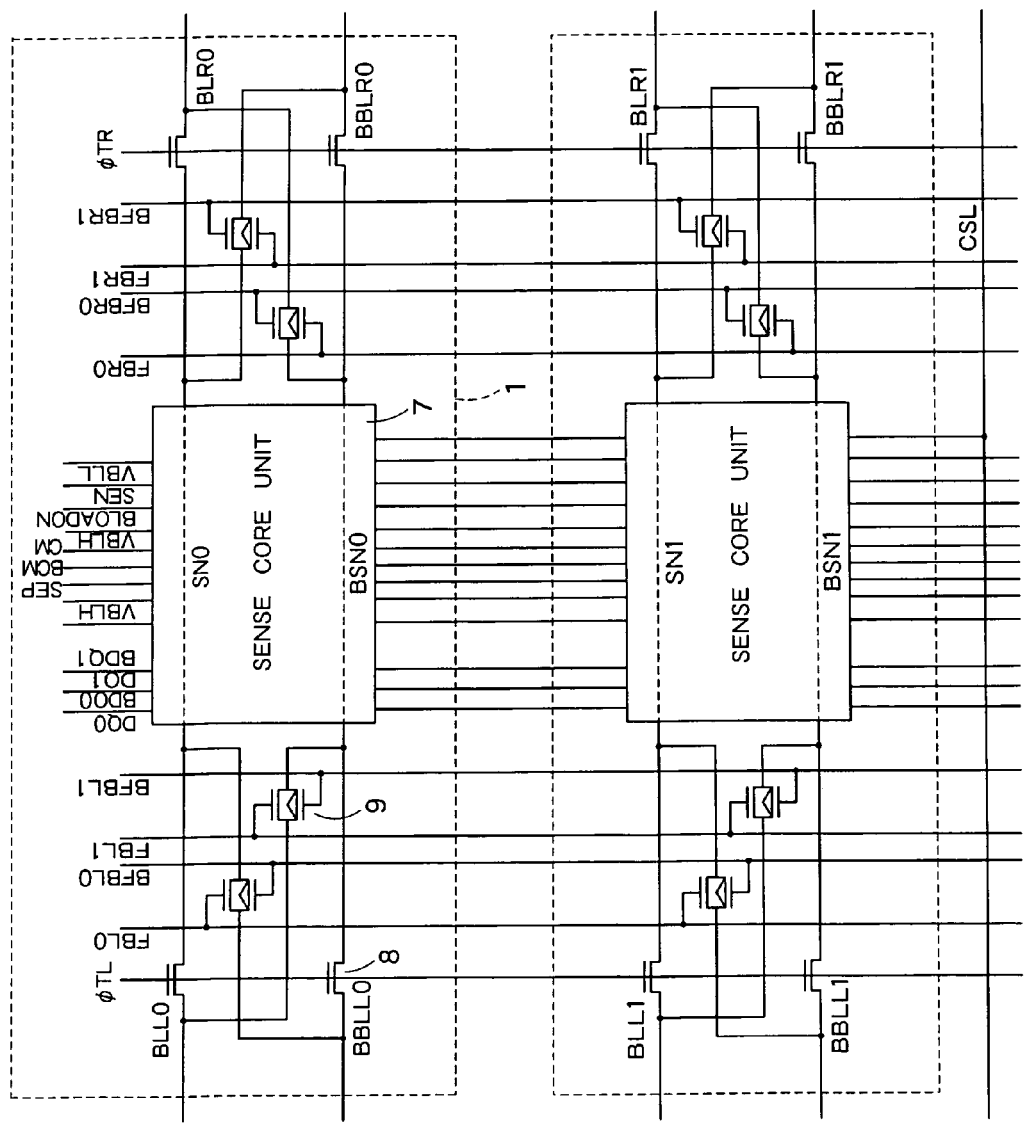
F I G. 28

SEMICONDUCTOR STORAGE APPARATUS

CROSS REFERENCE TO RELATED APPLICATIONS

This application is based upon and claims the benefit of priority from the prior Japanese Patent Application No. 2004-252846, filed on Aug. 31, 2004, the entire contents of which are incorporated herein by reference.

BACKGROUND OF THE INVENTION

1. Field of the Invention

The present invention relates to a semiconductor storage apparatus including sense amplifiers to sense data in memory cells.

2. Related Art

As for the conventional DRAM cell consisted of one transistor and one capacitor including a trench capacitor or a stacked capacitor, there is a concern that its fabrication may become difficult as it becomes finer. As candidate for a future DRAM cell, a new memory cell FBC (Floating Body Cell) is proposed (see Japanese Patent Application Laid-Open Nos. 2003-68877 and 2002-246571). In the FBC, majority carriers are stored in a floating body of an FET (Field Effect Transistor) formed on SOI (Silicon on Insulator) or the like, to store information.

In such an FBC, an element unit for storing one bit information is formed of only one MISFET (Metal Insulator Semiconductor Field Effect Transistor). Therefore, the occupation area of one cell is small, and storage elements having a large capacity can be formed in a limited silicon area. It is considered that the FBC can contribute to an increase of the storage capacity.

The principle of writing and reading for an FBC formed on PD-SOI (Partially Depleted-SOI) can be described as follows by taking an N-type MISFET as an example. A state of "1" is defined as a state in which there are a larger number of holes. On the contrary, a state in which the number of holes is smaller is defined as "0".

The FBC includes an nFET formed on, for example, SOI. Its source is connected to GND (0 V) and its drain is connected to a bit line (BL), whereas its gate is connected to a word line (WL). Its body is electrically floating. For writing "1" into the FBC, the transistor is operated in the saturation state. For example, the word line WL is biased to 1.5 V and the bit line BL is biased to 1.5 V. In such a state, a large number of electron-hole pairs are generated near the drain by impact ionization. Among them, electrons are absorbed to the drain terminal. However, holes are stored in the body having a low potential. The body voltage arrives at a balanced state in which a current generating holes by impact ionization balances a forward current of a p-n junction between the body and the source. The body voltage is approximately 0.7 V.

A method of writing data "0" will now be described. For writing "0", the bit line BL is lowered to a negative voltage. For example, the bit line BL is lowered to −1.5 V. As a result of this operation, a p-region in the body and an n-region connected to the bit line BL are greatly forward-biased. Therefore, most of the holes stored in the body are emitted into the n-region. A resultant state in which the number of holes has decreased is the "0" state. As for the data reading, "1" and "0" is distinguished by setting the word line WL to, for example, 1.5 V and the bit line BL to a voltage as low as, for example, 0.2 V, operating the transistor in a linear region, and detecting a current difference by use of an effect (body effect) that a threshold voltage (Vth) of the transistor differs depending upon the number of holes stored in the body.

The reason why the bit line voltage is set to a voltage as low as 0.2 V at the time of reading in this example is as follows: if the bit line voltage is made high and the transistor is biased to the saturation state, then there is a concern that data that should be read as "0" may be regarded as "1" because of impact ionization and "0" may not be detected correctly.

The FBC memory includes a plurality of cell arrays including a plurality of FBCs, and sense amplifiers. Each sense amplifier senses data read out from a specific FBC in a cell array. The sense amplifier in the conventional FBC memory has a configuration in which one node selected from a plurality of bit lines and sense amplifiers are arranged for the selected bit lines. The reason why such a configuration can be adopted is that nondestructive readout is supposed to be possible for the FBC. In other words, the FBC is thought to have a feature that data in cells that are not read are not destroyed even if a word line is selected and the data continues to be retained as they are if the word line is restored to the retaining level.

In subsequent characteristic evaluation of the FBC, however, it has been found that the FBC is not necessarily a non-destructive read-out cell. Because it has been found that the charge pumping phenomenon affects the characteristics of the cell. If the gate of the transistor is pumped a plurality of times and thereby the inversion state and the accumulation state on the silicon surface are repeated alternately, holes gradually disappear at an interface between the silicon surface and $SiO_2$. This is the charge pumping phenomenon. The number of holes that disappear due to one state change between inversion and accumulation depends on a density Nit of interface levels at the $Si-SiO_2$ interface. For example, supposing that $Nit=1\times10^{10}$ $cm^{-2}$ and W (channel width)/L (channel length) of a cell transistor=0.1 μm/0.1 μm, the area of the $Si-SiO_2$ interface becomes $1.0\times10^{-10}$ $cm^2$ per cell and consequently the number of interface levels per cell becomes approximately one on the average.

The number of holes stored in one FBC has a difference of approximately 1,000. If the word line WL is subjected to pumping approximately 1,000 times, therefore, data "1" completely changes to data "0". Practically, if the word line WL is subjected to pumping approximately 500 times, then the readout margin for the data "1" is lost and the risk that fail may occur becomes high. Therefore, the FBC is neither a destructive read-out cell nor a complete non-destructive read-out cell. It is found that the FBC is so to speak a "quasi non-destructive read-out cell".

If the sense amplifier circuit of the conventional scheme is applied to such an FBC, data is not written back even when the word line is selected. If the word line is activated during the refresh operation interval approximately 500 times, therefore, a fail in which data "1" changes to "0" occurs. Regardless of whether the cell is selected for reading/writing, therefore, it becomes necessary to design a sense amplifier with some measure against the charge pumping phenomenon taken on all "1" data cells for which the word line is activated.

Furthermore, the conventional sense amplifier has a problem that the busy rate of the refresh operation becomes high because the number of sense amplifiers simultaneously activated at the time of refresh operation is small.

SUMMARY OF THE INVENTION

A semiconductor storage apparatus according to one embodiment of the present invention, comprising:

a pair of first and second bit lines;

a cell array having a plurality of memory cells connected to the first or second bit line;

a sense amplifier which is provided corresponding to a pair of first and second bit lines and senses data read out from the memory cell, wherein the sense amplifier includes a current mirror circuit having first and second current paths connected directly or indirectly to the pair of first and second bit lines; and the current mirror circuit includes:

a first transistor which has a gate and a drain short-circuited to each other and flows a reference current between the source and the drain thereof; and a second transistor, of which gate is connected to a gate of the first transistor, and which flows a current passing through the memory cell to be read out between a source and a drain thereof.

A semiconductor storage apparatus according to one embodiment of the present invention, comprising:

a pair of first and second bit lines;

a cell array having a plurality of memory cells connected to the first or second bit line;

a sense amplifier which is provided corresponding to a pair of first and second bit lines and senses data read out from the memory cell, wherein the sense amplifier includes a current mirror circuit having first and second current paths connected directly or indirectly to the pair of first and second bit lines; and the current mirror circuit includes:

a first and a second transistors which are connected directly or indirectly to the pair of first and second bit lines, and of which gates are connected to each other;

a third transistor which controls whether the gate and a drain of the first transistor are short-circuited; and a fourth transistor which controls whether the gate and a drain of the second transistor are short-circuited, said first or second transistor having the gate and the drain short-circuited to each other and flowing a reference current between a source and the drain, and the other flowing a current passing through the memory cell to be read out between a source and the drain, based on whether the third and fourth transistors is ON or OFF.

BRIEF DESCRIPTION OF THE DRAWINGS

FIG. 3 is a detailed circuit diagram showing an internal configuration of a sense core unit provided within the sense amplifier shown in FIG. 2.

FIG. 5 is a diagram showing potential variation of word lines and sense nodes.

FIG. 7 is a circuit diagram corresponding to FIG. 6.

FIG. 8 is a circuit diagram corresponding to FIG. 4.

FIG. 10 is a circuit diagram showing connection relationship between the current mirror circuit and the dummy cells when the dummy cells is connected to the current path of the PFET.

FIG. 11 is a circuit diagram showing connection relationship between the current mirror circuit and the dummy cells when the FBC is connected to the current path of the PFET.

FIG. 12A is a diagram showing I-V characteristics of transistors on the current path on the FBC 3 side in the current load circuit 21, and FIG. 12B is a diagram showing I-V characteristics of transistors on the current path on the dummy cell 5 side in the current load circuit 21.

FIG. 13 is a circuit diagram showing an internal configuration of a semiconductor storage apparatus according to the second embodiment of the present invention.

FIG. 16 is an operational timing diagram according to the second embodiment in the case where a word line WLR0 is activated.

FIG. 17 is a circuit diagram corresponding to FIG. 16.

FIG. 18 is a circuit diagram corresponding to FIG. 15.

FIG. 19 is an equivalent circuit diagram in the case where the word line WLR0 is activated.

FIG. 20 is an equivalent circuit diagram in the case where the word line WLR1 is activated.

FIG. 23 is a circuit diagram showing an example of an internal configuration of the current source Iref.

FIG. 25 is a circuit diagram showing a second variant of the current source Iref.

FIG. 28 is a circuit diagram showing internal configuration of the sense amplifier showing a modified example.

DETAILED DESCRIPTION OF THE INVENTION

Hereafter, embodiments of the present invention will be described with reference to the drawings.

First Embodiment

Figure 1:
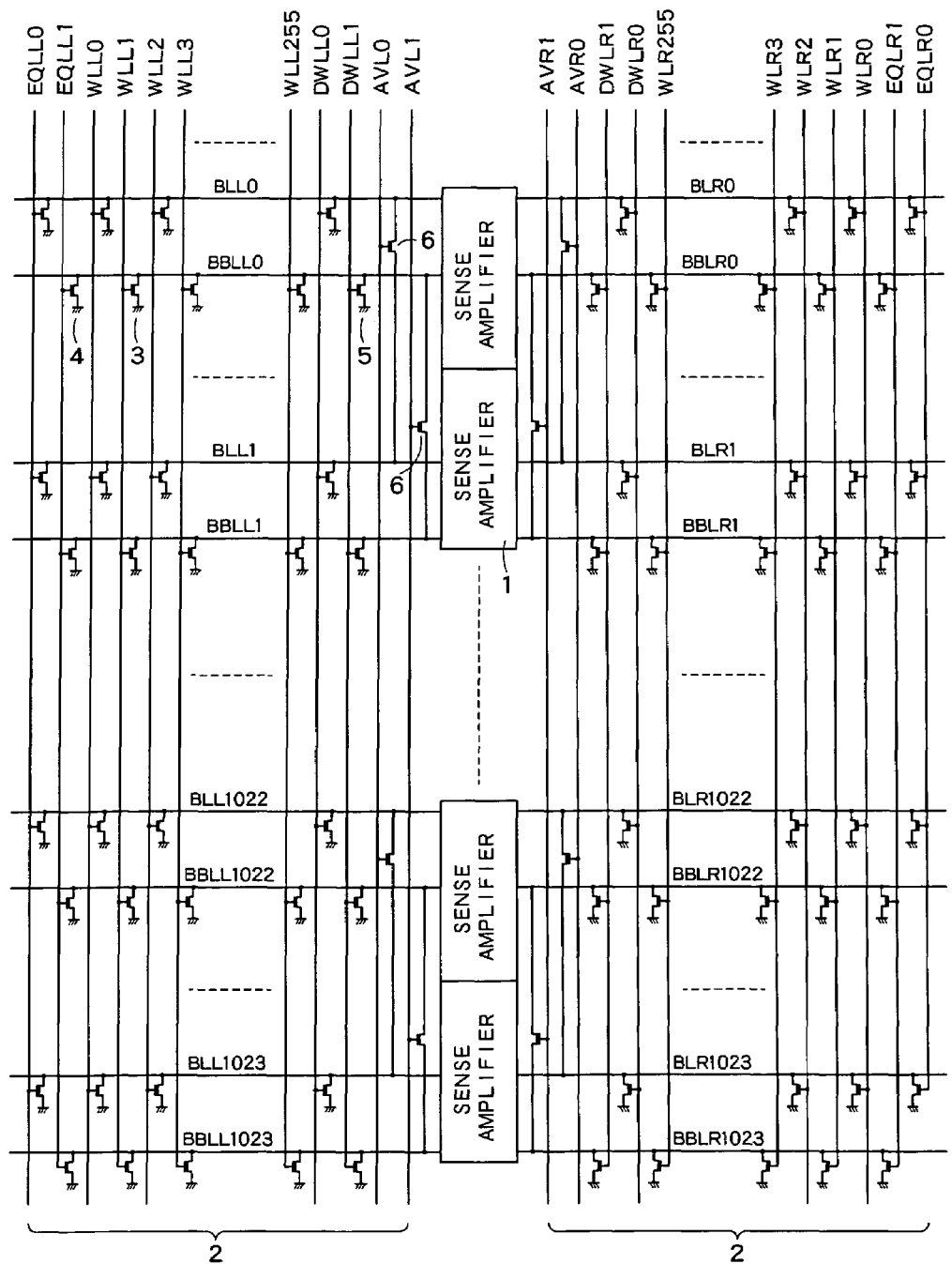
FIG. 1 is a circuit diagram showing an internal configuration of a semiconductor storage apparatus according to a first embodiment of the present invention.
Figure 2:
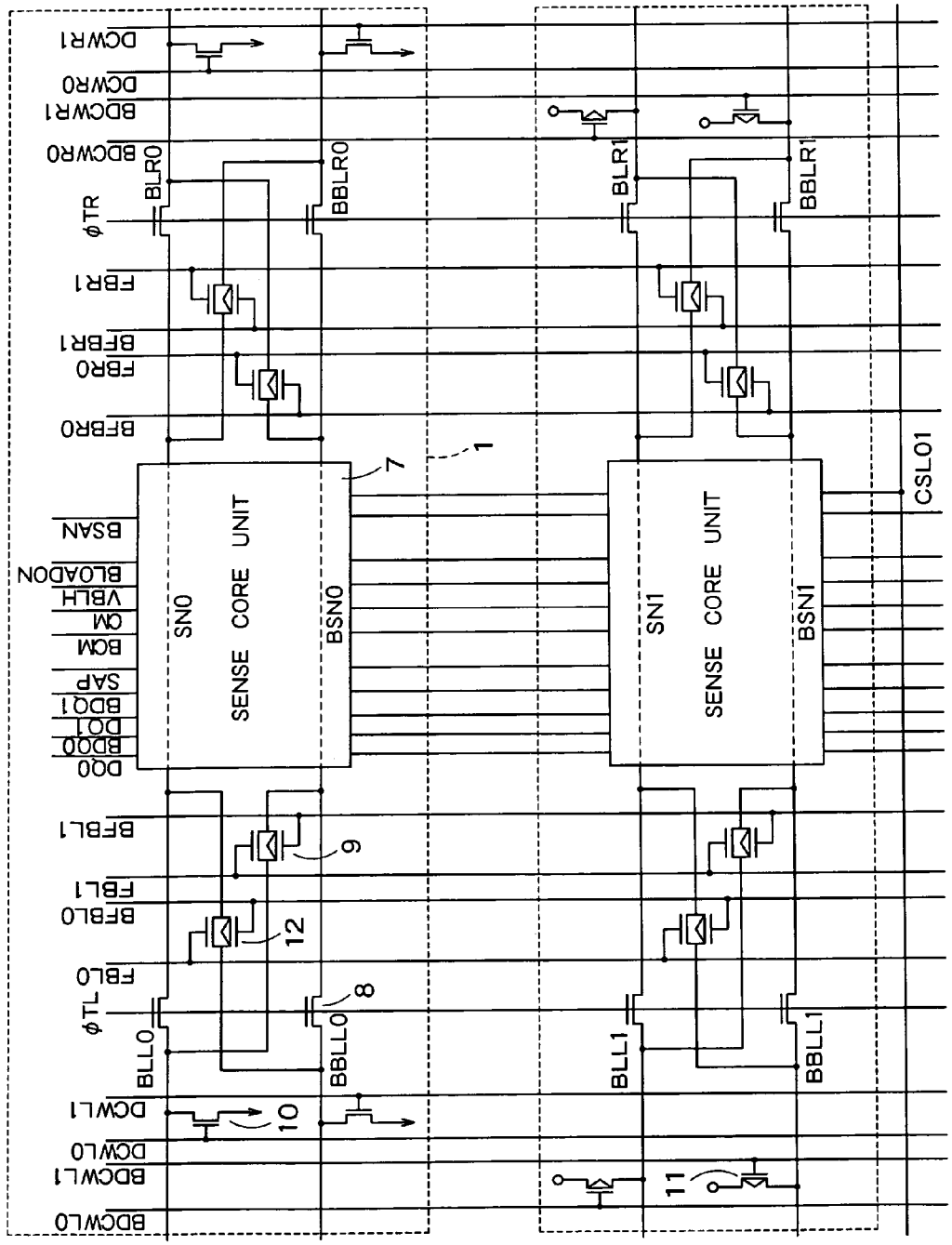
FIG. 2 is a detailed circuit diagram showing an internal configuration of a sense amplifier 1 provided in the semiconductor storage apparatus shown in FIG. 1.

FIG. 1 is a circuit diagram showing an internal configuration of a semiconductor storage apparatus according to a first embodiment of the present invention. FIG. 2 is a detailed circuit diagram showing an internal configuration of a sense amplifier 1 provided in the semiconductor storage apparatus shown in FIG. 1. FIG. 3 is a detailed circuit diagram showing an internal configuration of a sense core unit provided within the sense amplifier shown in FIG. 2.

The semiconductor storage apparatus shown in FIG. 1 includes a plurality of sense amplifiers 1 arranged side by side approximately in the center, and cell arrays 2 arranged on left and right sides of the sense amplifiers 1. Although omitted in FIG. 1, the semiconductor storage apparatus according to the present embodiment includes a read/write control circuit such as column decoders and row decoders.

As shown in FIG. 1, a cell array 2 includes 256 word lines and 1024 bit lines arranged on the left or right side of the sense amplifiers 1. Two adjacent bit lines are paired. FBCs 3 are disposed near intersections of even-numbered word lines and true lines of respective bit lines and intersections of odd-numbered word lines and complement lines of respective bit lines, respectively. In this way, the semiconductor storage apparatus shown in FIG. 1 has a cell arrangement corresponding to a folded bit line scheme.

Each of the cell arrays 2 arranged on the left and right sides of the sense amplifiers 1 includes bit line equalize transistors 4, each of which short-circuits a bit line to a source potential of the FBCs 3, and dummy cells 5. The bit line equalize transistors 4 are connected near intersections of equalize signal lines EQLL0, EQLL1, EQLR0 and EQLR1 and bit lines. Dummy cells 5 are connected near intersections of dummy word lines DWLL0, DWLL1, DWLR0 and DWLR1 and bit lines. Prior to read operation for FBCs 3, data "1" and "0" are written into the dummy cells 5 alternately in the word line direction by a circuit which will be described later.

NMOS transistors 6 are connected between one line included in a bit line pair and one line included in an adjacent bit line pair. Signals AVL0, AVR0, AVL1 and AVR1 are applied to gates of the NMOS transistors 6. Each of these NMOS transistors 6 is used to generate an intermediate potential by short-circuiting a bit line connected to a dummy cell 5 storing "1" to a bit line connected to a dummy cell 5 storing "0".

As shown in FIG. 2, the sense amplifier 1 includes a sense core unit 7 and its peripheral circuit portions. Transfer gates 8 formed of NMOS transistors are connected between the sense core unit 7 and a pair of bit lines. These transfer gates 8 are switched to turn on or off by φTL and φTR. Hereafter, paths located on the sense core unit 7 side as compared with the transfer gates 8 are referred to as sense nodes SN0, BSN0, SN1 and BSN1.

Transfer gates 9 for switching to cross-connect sense nodes to bit lines are provided in peripheral circuits of the sense core units 7. NMOS transistors in the transfer gates 9 are controlled by signals FBL0, FBL1, FBR0 and FBR1, whereas PMOS transistors in the transfer gates 9 are controlled by signals BFBL0, BFBL1, BFBR0 and BFBR1.

Transistors 10 are connected to bit lines BLL0, BBLL0, BLR0 and BBLR0 to couple the bit lines to a negative voltage VBLL. These transistors 10 are controlled by signals DCWL0 and DCWL1 to turn on or off and to write "0" into dummy cells 5 coupled to bit lines BLL0, BBLL0, BLR0 and BBLR0. A transistor 11 is connected to each of adjacent bit lines BLL1, BBLL1, BLR1 and BBLR1 to couple the bit line to a positive voltage VBLH. These transistors 11 are controlled by signals BDCWL0 and BDCWL1 to turn on or off and to write "1" into dummy cells 5 coupled to bit lines BLL1, BBLL1, BLR1 and BBLR1.

For example, it is now supposed that word line WLL0 in the cell array 2 located on the left side of the sense amplifiers 1 is activated. In this case, the dummy word line DWLL1 and the signal AVL1 are also activated at the same time. As a result, FBCs 3 are coupled to the bit lines BLL0 and BLL1. At the same time, dummy cells 5 having "0" written therein are coupled to a bit line BBLL0, and dummy cells 5 having "1" written therein are coupled to a bit line BBLL1. And the transistor 6 turns on, and the bit lines BBLL0 and BBLL1 are short-circuited to each other. Therefore, currents flowing through the two dummy cells 5 are averaged. It is equivalent to that an intermediate current between "1" and "0" cell currents flows through the bit lines BBLL0 and BBLL1. In the case of a "0" cell, therefore, potentials on the sense nodes SN0 and SN1 become higher than reference potentials appearing on the sense nodes BSN0 and BSN1. In the case of a "1" cell, potentials on the sense nodes SN0 and SN1 become lower than the reference potentials appearing on the sense nodes BSN0 and BSN1. When these potential differences have been sufficiently developed, a signal BSAN becomes a low level and a signal SAP becomes a high level.

As shown in FIG. 3, the sense core unit 7 includes a current load circuit 21 formed of a current mirror circuit, and dynamic latch circuits 22 and 23 connected to the pair of sense nodes SN0 and BSN0. The signal BSAN is input to a connection node between two NMOS transistors forming the dynamic latch circuit 22. The signal SAP is input to a connection node between two PMOS transistors forming the dynamic latch circuit 23. When the potential difference between the pair of sense nodes SN0 and BSN0 or SN1 and BSN1 has been sufficiently developed and the signals BSAN and SAP become respectively the low level and the high level, the dynamic latch circuits 22 and 23 conduct latch operation.

A current load circuit 21 includes PFETs 24 and 25 connected in series between the voltage VBLH and the sense node SN0, PFETs 26 and 27 connected in series between the voltage VBLH and the sense node BSN0, a PFET 28 connected between the PFET 25 at its gate and the sense node SN0, and a PFET 29 connected between the PFET 27 at its gate and the sense node BSN0. A signal BLOADON is supplied to gates of the PFETs 24 and 26, and a signal CM is supplied to the PET 28 at its gate. A signal BCM is supplied to the PET 29 at its gate. The gates of the PETs 25 and 27 are short-circuited to each other to form a current mirror circuit.

As described later, the current load circuit 21 switches the connection between the current mirror circuit and the sense nodes so as to surely connect dummy cells 5 to a current path that passes through the PET 25 or 27 with its gate short-circuited to its drain in the current mirror circuit included in the current load circuit 21. The connection switching is conducted by the transistors 28 and 29. Hereafter, a transistor with its gate short-circuited to its drain is referred to as current mirror connected transistor.

NFETs 30 and 31 are connected between data line pairs DQ0, BDQ0, DQ1 and BDQ1 and the sense nodes SN0, BSN0, SN1 and BSN1. The NFETs 30 and 31 are controlled to turn on or off by a column selection line CSL01.

Figure 4:
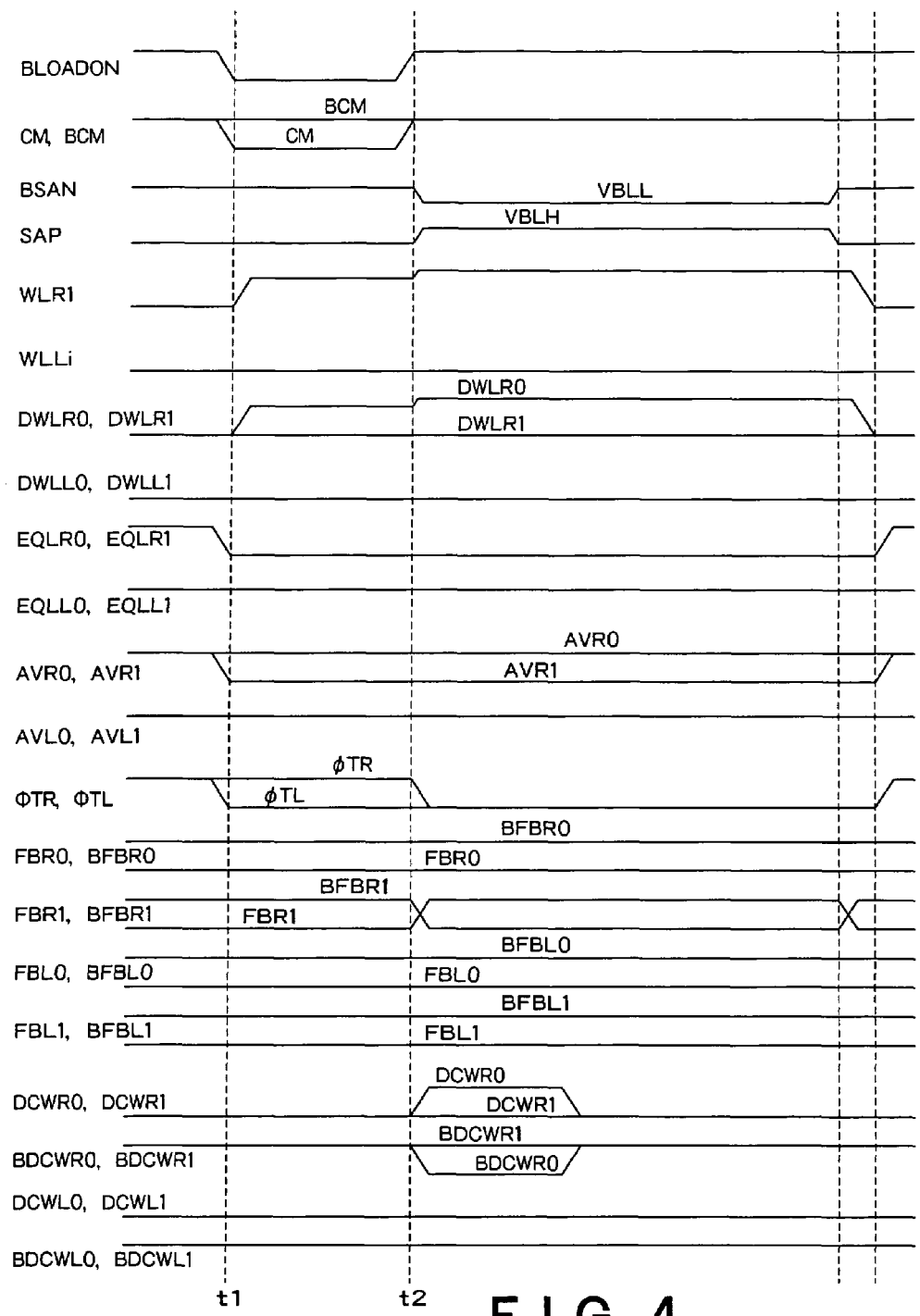
FIG. 4 is a diagram showing operation timing of the semiconductor storage apparatus according to the present embodiment.

FIG. 4 is a diagram showing operation timing of the semiconductor storage apparatus according to the present embodiment. FIG. 4 shows the case where a word line WLR1 and a dummy word line DWLR0 in the cell arrays 2 on the right side of the sense amplifiers 1 shown in FIG. 1 are activated. Since cell arrays 2 on the left side remain to be inactive, bit line equalize signals EQLL0 and EQLL1 on the left side remain at the high level. However, both activated bit equalize signals EQLR0 and EQLR1 on the right side fall from the high level to the low level, and bit lines become floating.

Averaged signals AVL0 and AVL1 of the dummy cells 5 on the inactive state side remain at the high level. An averaged signal AVR0 of the dummy cell 5 on the active state side is kept the high level. However, the averaged signal AVR1 becomes a low level, and all bit lines connected to the cell are separated individually.

Among signals for controlling the transfer gates 8 between the bit lines and the sense core unit, an inactive state side signal φTL becomes a low level at time t1 and corresponding transfer gates 8 are cut off. However, the active state side signal φTR remains at the high level, and corresponding transfer gates 8 maintain the connection state.

Nearly at the same time when the word line and the dummy word line are activated at time t1, the signal CM for switching the connection of the current mirror circuit becomes a low level. However, the signal BCM maintains its high level. As a result of this operation, the sense node SN0 side connected to the dummy cell 5 is current mirror connected. In other words, the sense node SN0 side is connected to a transistor with its gate short-circuited to its drain in the current mirror circuit.

Nearly at the same time as t1, a signal BLOADON becomes a low level, and equal load currents flow from the positive voltage VBLH to the sense nodes SN0 and BSN0. Voltage changes at the sense nodes SN0 and BSN0 at this time are shown in FIG. 5, which is a voltage waveform diagram.

When a sufficient potential difference is generated between the pair of sense nodes SN0 and BSN0 (time t2), the signal BSAN becomes a negative voltage VBLL and the signal SAP becomes a positive voltage VBLH. As a result, the signal between the pair of sense nodes SN0 and BSN0 is amplified by the dynamic latch circuit 22.

Nearly at the same time (time t2), the signal φTR becomes the low level and the transfer gate 8 is cut off. The signals FBR1 and BFBR1 become the high level and the low level, respectively, and the transfer gate 9 between the bit line connected to the FBC 3 in the cell array 2 on the right side and the sense node SN0 turns on. As a result, a signal amplified by the dynamic latch circuit 22 is fed back to the FBC 3 side, and data rewriting is conducted.

Nearly at the same time (t2), signals DCWR0 and BDCWR0 become a high level and a low level, respectively, and the negative voltage VBLL and the positive voltage VBLH are applied to corresponding dummy bit lines, respectively. As a result, data "0" and "1" are written into dummy cells 5 connected to the dummy bit lines, respectively. Since at this time the transfer gates 8 are cut off, the bit line connected to the dummy cell is separated from the sense node and writing into the dummy cell 5 can be conducted regardless of the state at the sense node. In other words, a signal read out onto the sense node is latched, and writing into the dummy cell 5 is also conducted nearly at the same time when the state is written into the FBC 3 back.

Figure 6:
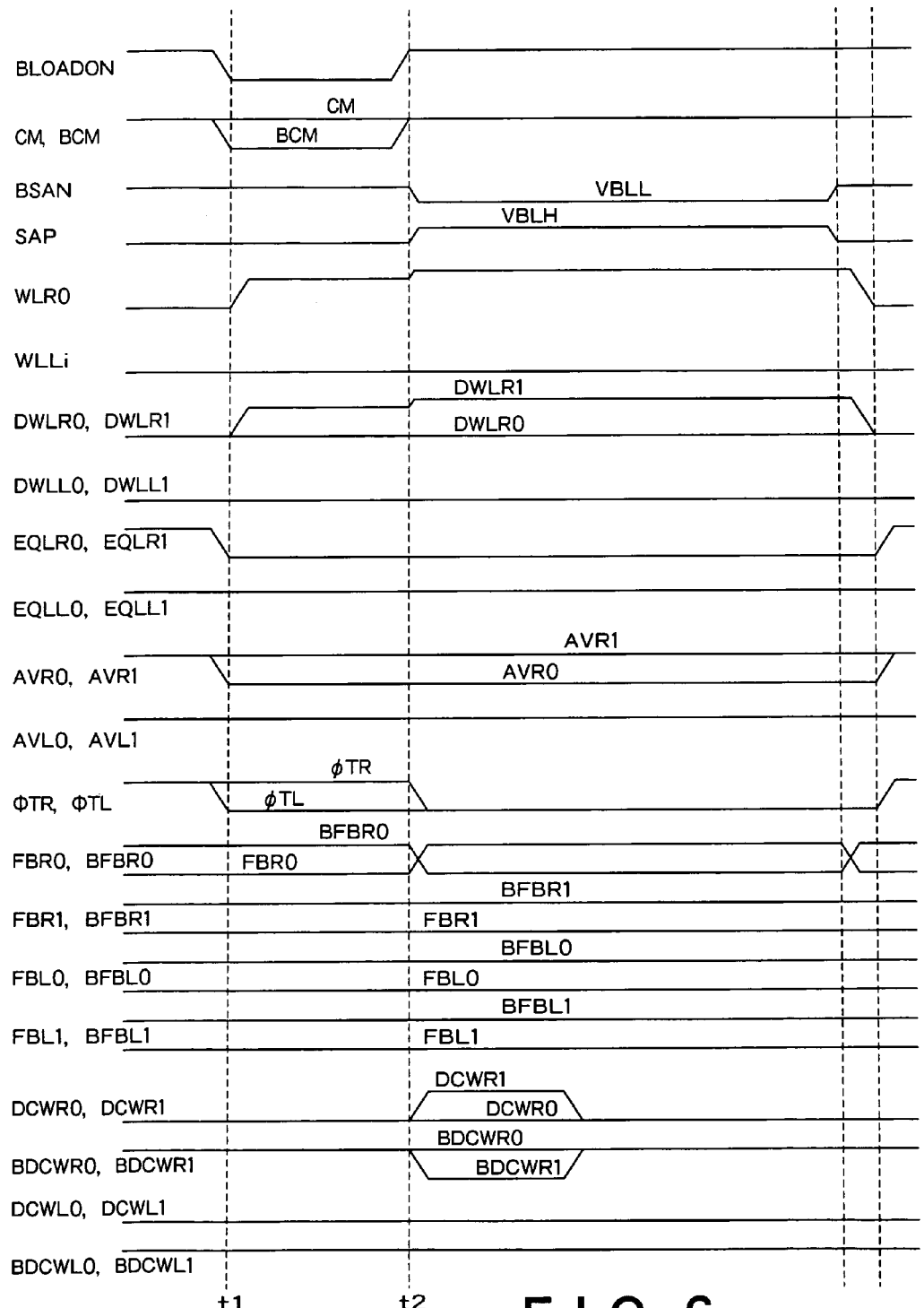
FIG. 6 is a timing diagram showing the case where the word line WLR0 and the dummy word line DWLR1 are activated.

FIG. 6 is a timing diagram showing the case where the word line WLR0 and the dummy word line DWLR1 are activated. In FIG. 6, logics of the signals AVR0 and AVR1, logics of the signals FBR0 and FBR1, logics of the signals BFBR0 and BFBR1, logics of the signals DCWR0 and DCWR1, and logics of the signals BDCWR0 and BDCWR1 are interchanged as compared with FIG. 4, respectively.

In FIG. 4, the signal input to the sense amplifier 1 is at a low level, and a signal BCM is at a high level. In FIG. 6, however, the signal BCM is at a low level and the signal CM is at a high level. The connection relation between the current mirror circuit and the sense node in the current load circuit 21 is reversed as compared with FIG. 5 by the logic interchange in these signals CM and BCM, and the sense node BSN0 side connected to the dummy cell 5 is connected to a current path of a PFET with its gate short-circuited to its drain in the current mirror circuit.

As a result of the operation heretofore described, a reference potential is always generated from the dummy cell 5 side and transferred to the FBC 3 side. Therefore, it becomes less susceptible to influence of dispersion in transistor thresholds.

FIGS. 7 and 8 are circuit diagrams showing connection relations in the current load circuit 21 equivalently. FIG. 7 shows a circuit diagram corresponding to FIG. 6 (the case where the word line WLR0 and the dummy word line DWLR1 are activated). FIG. 8 shows a circuit diagram corresponding to FIG. 4 (the case where the word line WLR1 and the dummy word line DWLR0 are activated).

For the sense amplifier 1 in the present embodiment, 256 word lines WLR0 to WLR 255 are activated. However, the selected dummy word line differs depending upon whether an even-numbered word line is activated or an odd-numbered word line is activated. For example, when activating an even-numbered word line, it is necessary to select the dummy word line DWLR1. When activating an odd-numbered word line, it is necessary to select the dummy word line DWLR0.

Regardless of whether an even-numbered word line is activated or odd-numbered word line is activated, in the present embodiment, a dummy cell 5 is surely connected to a current path that passes through a transistor with its gate short-circuited to its drain in the two transistors 25 and 27 forming the current mirror circuit, whereas an FBC 3 is surely connected to the other transistor.

Figure 9A:
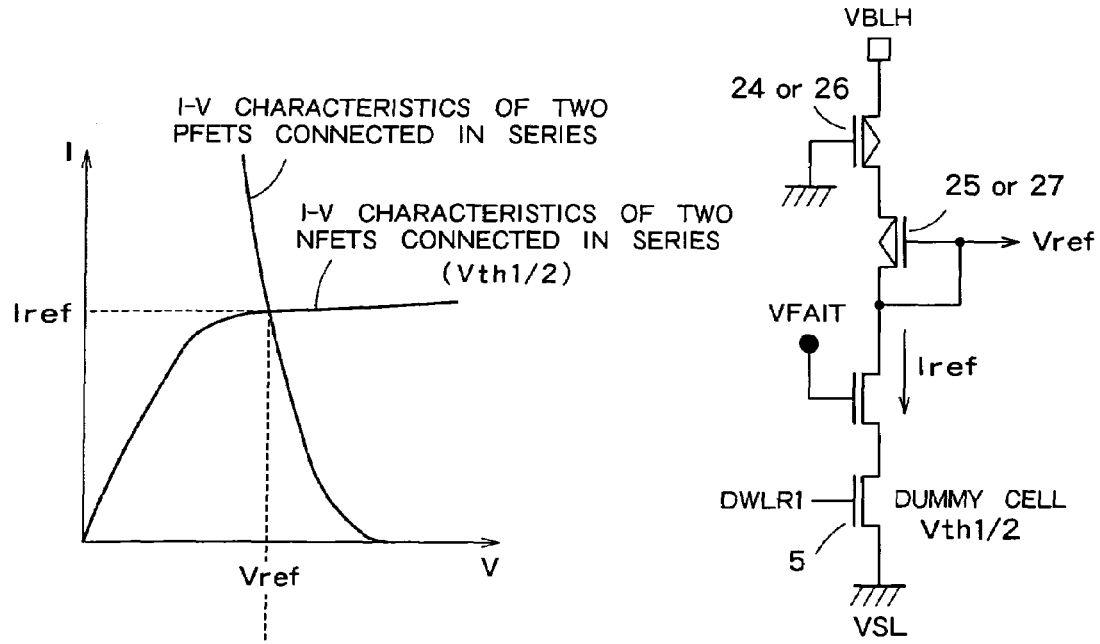
FIG. 9A is a diagram showing I-V characteristics of transistors on the current path of the dummy cell 5 side shown in FIGS. 7 and 8.
Figure 9B:
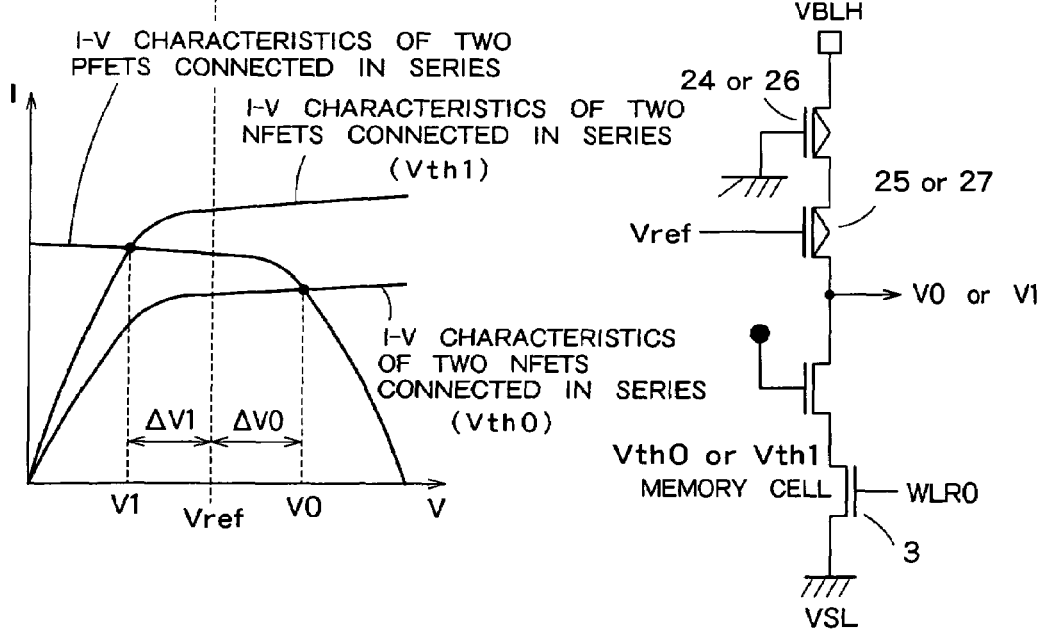
FIG. 9B is a diagram showing I-V characteristics of transistors on the current path of the FBC 3 side.

FIG. 9A is a diagram showing I-V characteristics of transistors on the current path of the dummy cell 5 side shown in FIGS. 7 and 8. FIG. 9B is a diagram showing I-V characteristics of transistors on the current path of the FBC 3 side.

As for the dummy cell 5 on the active state side, averaging is conducted by the signal AVR0 and a threshold of the dummy cell is Vth1/2. As shown in FIG. 9A, therefore, the gate voltage of a PFET is represented by Vref.

On the other hand, the I-V characteristics of the FBC 3 differs depending upon whether data "0" is stored or data "1" is stored. Therefore, a voltage at a connection node between a PFET and an NFET becomes V0 or V1. Depending upon "0" is stored in the FBC 3 or "1" is stored in the FBC 3, therefore, the voltage difference between the voltage at the connection node between the PFET and the NFET and the reference voltage Vref becomes ΔV1 or ΔV0.

On the other hand, FIGS. 10 and 11 are circuit diagrams showing an example in which the connection relation between the current mirror circuit and the dummy cell 5 does not change according to the kind of the activated word line. In the circuit shown in FIG. 10, the dummy cell is connected to a current path of the PFET 25 or 27 with its gate short-circuited to its drain in the current mirror circuit. In the circuit shown in FIG. 11, the FBC 3 is connected in a current path of the PFET 25 or 27 with its gate short-circuited to its drain in the current mirror circuit.

In the case of FIG. 10, the reference potential is generated on the sense node connected to the dummy cell in the same way as FIGS. 7 and 8. In the case of FIG. 11, however, the reference potential is generated on the sense node side connected to the FBC 3.

The I-V characteristics in the case of FIG. 10 become similar to those shown in FIGS. 9A and 9B. However, the I-V characteristics in the case of FIG. 11 becomes as shown in FIGS. 12A and 12B. FIG. 12A is a diagram showing I-V characteristics of transistors on the current path on the FBC 3 side in the current load circuit 21. FIG. 12B is a diagram showing I-V characteristics of transistors on the current path on the dummy cell 5 side in the current load circuit 21.

In the case of the circuit shown in FIG. 11, I-V characteristics of the NFET differ depending upon whether "0" is stored or "1" is stored in the FBC 3. Therefore, the voltage at a connection node between the PFET and the NFET also becomes VREF0 or VREF1.

In the same way, the voltage at the connection node between the PFET and the NFET becomes a voltage V0 or V1 according to data stored in the FBC 3 as shown in FIG. 12B. In this case, the signal level becomes ΔV1=V1−Vref1 or ΔV0=Vref0−V0. In any case, the sense node on the FBC 3 cell side storing "1" becomes lower in voltage than the sense node on the dummy cell 5 side, and the sense node on the FBC 3 cell side storing "0" becomes higher in voltage than the sense node on the dummy cell 5 side.

Even in the case where the connection relation between the current mirror circuit and the sense node does not change according to the kind of the activated word line as shown in FIG. 10 and FIG. 11, the sense amplifier 1 can conduct normal sense operation. However, it can be shown that the signal becomes smaller for the case where the two cells whose associated dummy cells are connected through the averaging transistors 6 have the opposite data than the case where the two cells have the same data. And this situation becomes much more severe if a minority number of "1"("0") cells are to be read among a majority number of "0"("1") cells for the system where many dummy cells are simultaneously averaged through a serial connection of the transistors 6. However, by always connecting the sense node connected to the dummy cell 5 to the PFET with its gate short-circuited to its drain in the current mirror circuit regardless of a difference in activation of a word line as shown in FIG. 7, a stable operation of sense amplifiers 1 that is not affected by neighboring data patterns can be constructed.

Thus, in the present embodiment, the dummy cell 5 is always connected in the current path with its gate short-circuited to its drain in the current mirror circuit in the sense amplifier 1 even if the activated word line is changed. Without being affected by neighboring cells' data patterns, therefore, a more stable sense margin can be ensured and stabilization in the sense operation conducted by the sense amplifier 1 can be achieved.

Second Embodiment

In a second embodiment, sensing of the FBC 3 is conducted by using a reference voltage VREF instead of the dummy cell 5.

Figure 14:
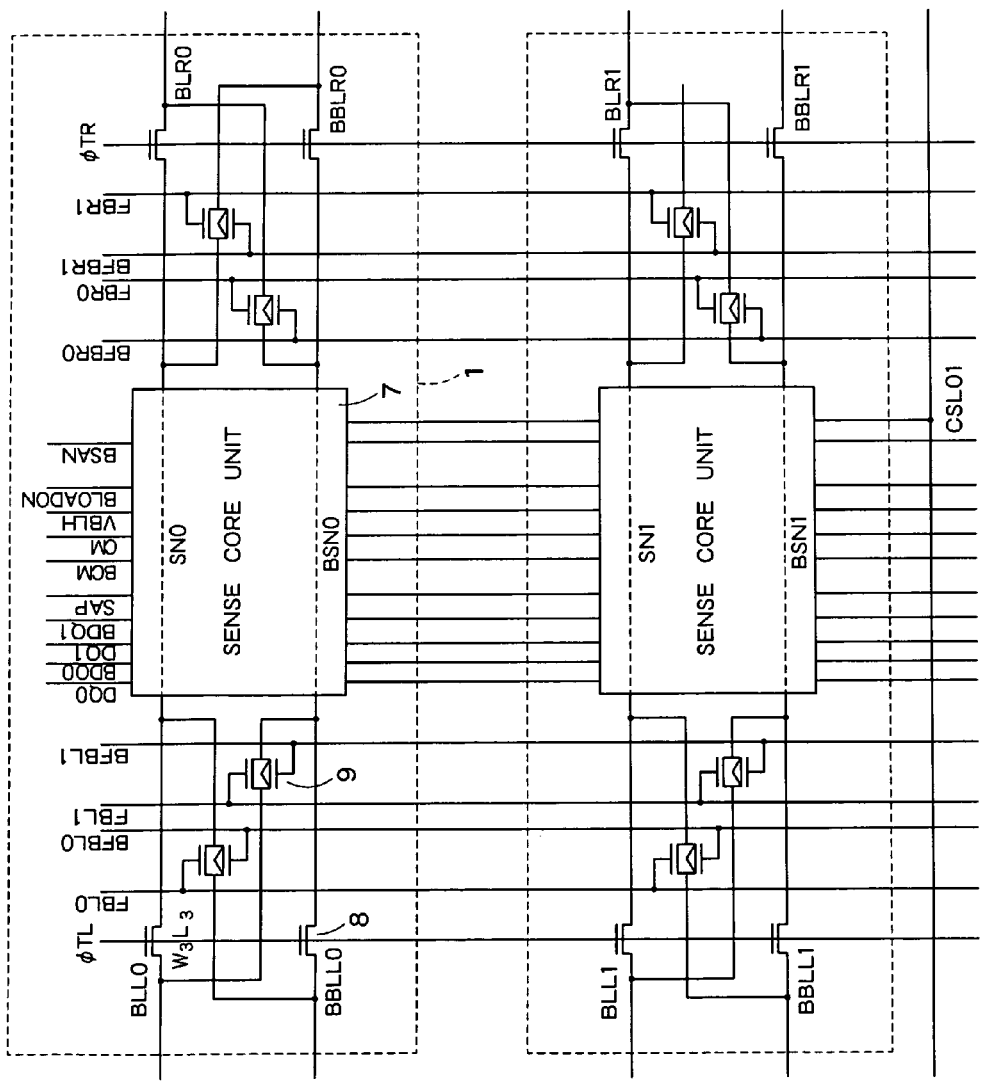
FIG. 14 is a detailed circuit diagram of a periphery around the sense amplifier 1 provided in the semiconductor storage apparatus shown in FIG. 13.

FIG. 13 is a circuit diagram showing an internal configuration of a semiconductor storage apparatus according to the second embodiment of the present invention. FIG. 14 is a detailed circuit diagram of a periphery around the sense amplifier 1 provided in the semiconductor storage apparatus shown in FIG. 13. The sense amplifier 1 in the second embodiment is formed of a circuit similar to that shown in FIG. 3.

In FIGS. 13 and 14, components common to those shown in FIGS. 1 and 2 are denoted by like characters, and hereafter differences will be mainly described. In the semiconductor storage apparatus shown in FIG. 13, the dummy cells 5 and the dummy word lines are eliminated from FIG. 1. Instead, transistors 31 for supplying a reference voltage VREFCELL to bit lines and control signals PASSL0, PASSL1, PASSR0 and PASSR1 are provided.

In the second embodiment, the reference voltage VREFCELL is applied to the sense node included in a pair of sense nodes of the sense amplifier 1 different from the sense node connected to the FBC 3. The sense node applied with the reference voltage VREFCELL is determined by transistors 31 each applied with a control signal PASSL0, PASSL1, PASSR0 or PASSR1 at its gates.

Figure 15:
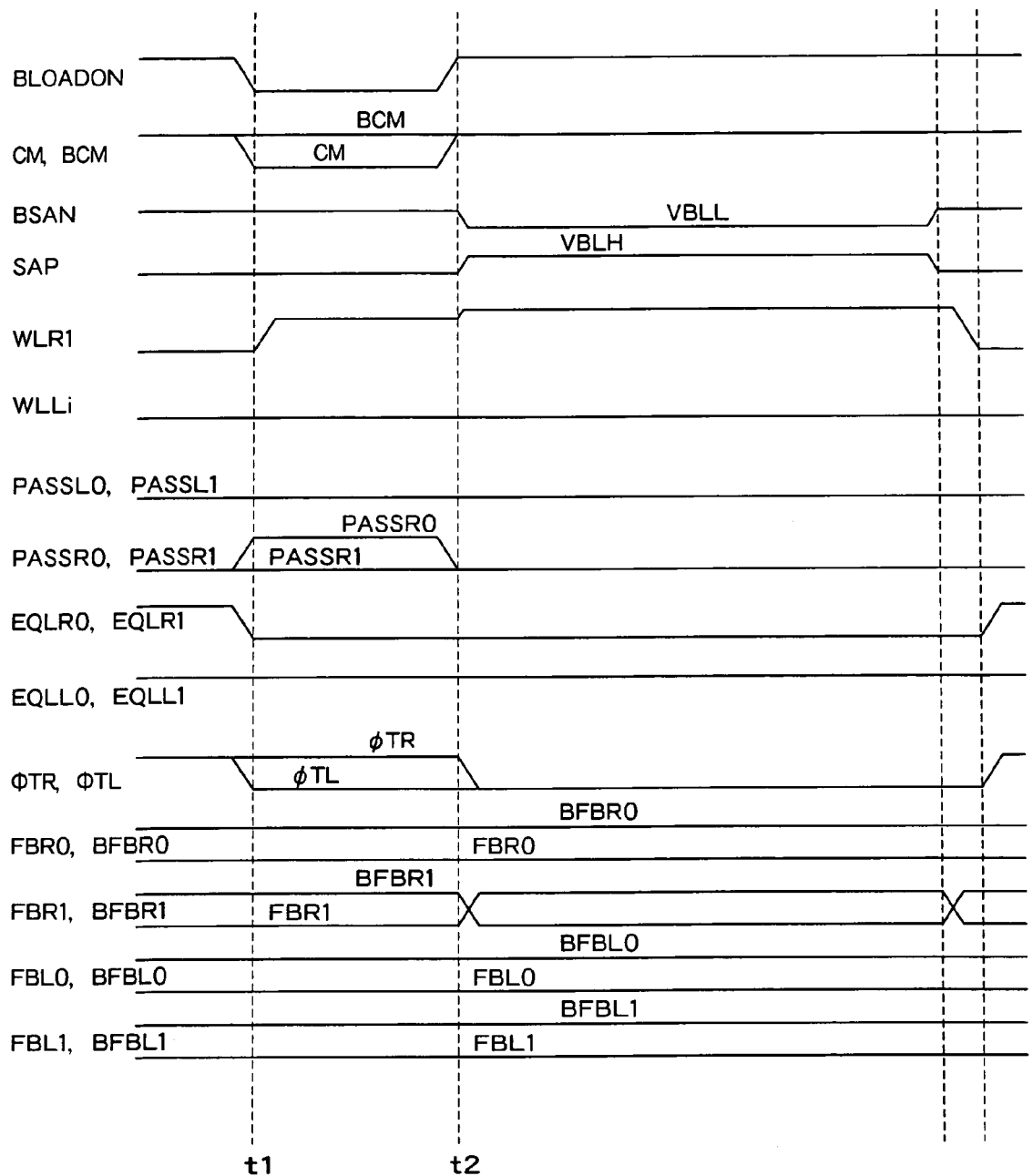
FIG. 15 is an operational timing diagram according to the second embodiment in the case where a word line WLR1 is activated.

FIGS. 15 and 16 are operation timing diagrams of the semiconductor storage apparatus according to the second embodiment. FIG. 15 shows the case where a word line WLR1 is activated. FIG. 16 shows the case where a word line WLR0 is activated.

At time t1 in FIG. 15, the word line WLR1 is activated, and signals CM and PASSR0 become a low level and a high level, respectively. As a result, the reference voltage VREFCELL is applied to the sense node SN0 paired with the sense node BSN0 that is in turn connected to the FBC 3, and a current equivalent to the current flowing through the dummy cell 5 in the first embodiment flows through the sense node SN0. Thus, data stored in the FBC 3 is sensed.

FIGS. 17 and 18 are circuit diagrams showing connection relations of a current load circuit 21 equivalently. FIG. 17 shows a circuit diagram corresponding to FIG. 16 (the case where the word line WLR0 is activated). FIG. 18 shows a circuit diagram corresponding to FIG. 15 (the case where the word line WLR1 is activated).

As shown in FIGS. 17 and 18, the reference voltage VREFCELL is equivalent to provision of the current source Iref. A transistor 31 for switching and controlling a sense node included in a pair of sense nodes and applied with the reference voltage VREFCELL is connected to the current source Iref in series.

In both cases shown in FIGS. 17 and 18, a transistor 25 or 27 with its gate short-circuited to its drain in a current mirror circuit is connected on the current Iref side. As a result, a stable sense margin can be ensured in the same way as FIGS. 7 and 8.

Here, as comparison examples for FIGS. 17 and 18, characteristics in the case where the FBC 3 or the current source Iref is connected on the transistor side with its gate short-circuited to its drain in the current mirror circuit by activating either the word line WLR0 or WLR1 will now be described. FIG. 19 is an equivalent circuit diagram in the case where the word line WLR0 is activated. FIG. 20 is an equivalent circuit diagram in the case where the word line WLR1 is activated. In the case of FIG. 19, the transistor 25 or 27 with its gate short-circuited to its drain in the current mirror circuit is connected to a sense node on the current source side. On the other hand, in the case of FIG. 20, the transistor 25 or 27 is connected to a sense node on the FBC 3 side.

Figure 21A:
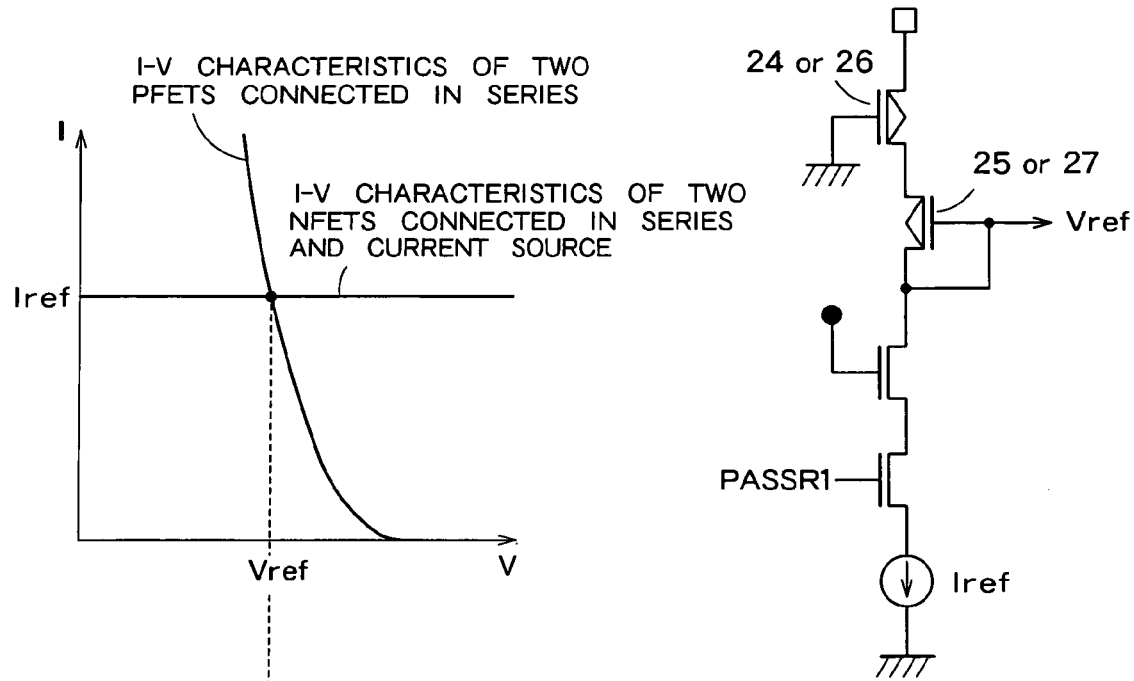
FIGS. 21A and 21B are I-V characteristic diagrams of the circuit shown in FIG. 19.
Figure 21B:
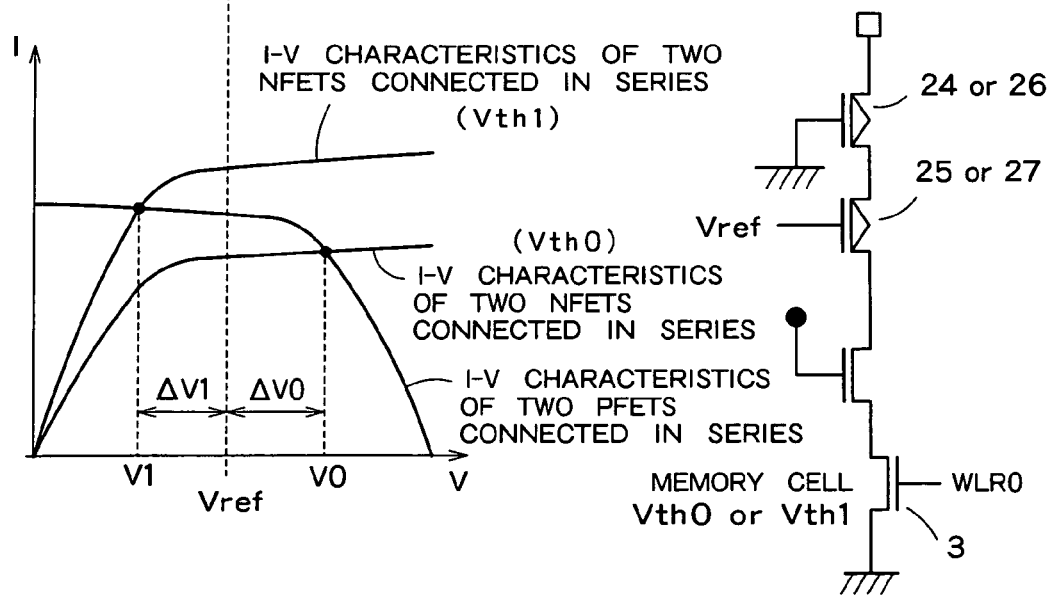
Figure 22A:
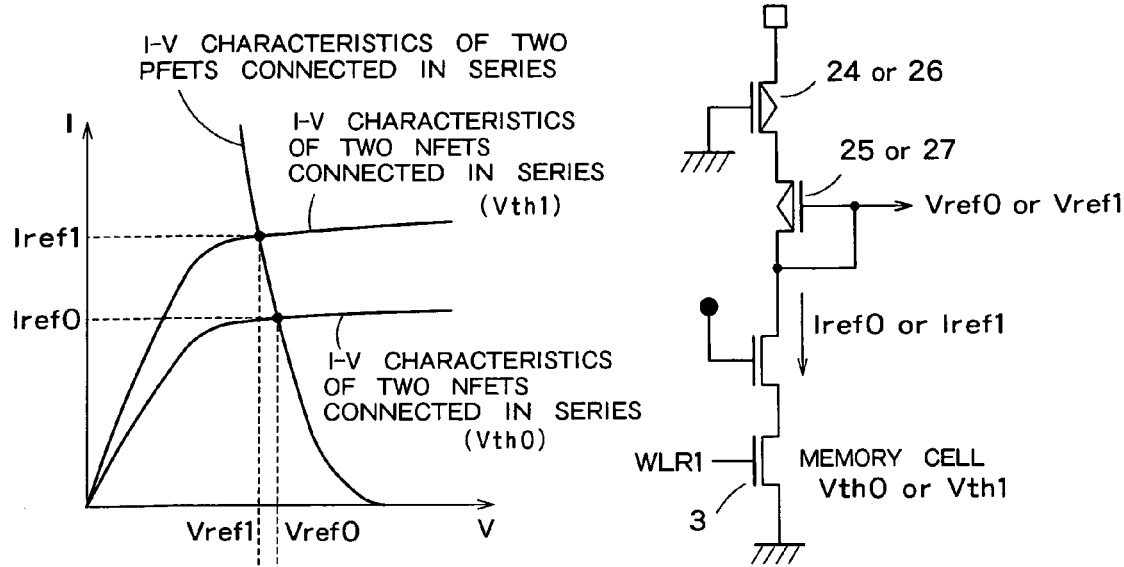
FIGS. 22A and 22B are I-V characteristic diagrams of the circuit shown in FIG. 20.
Figure 22B:
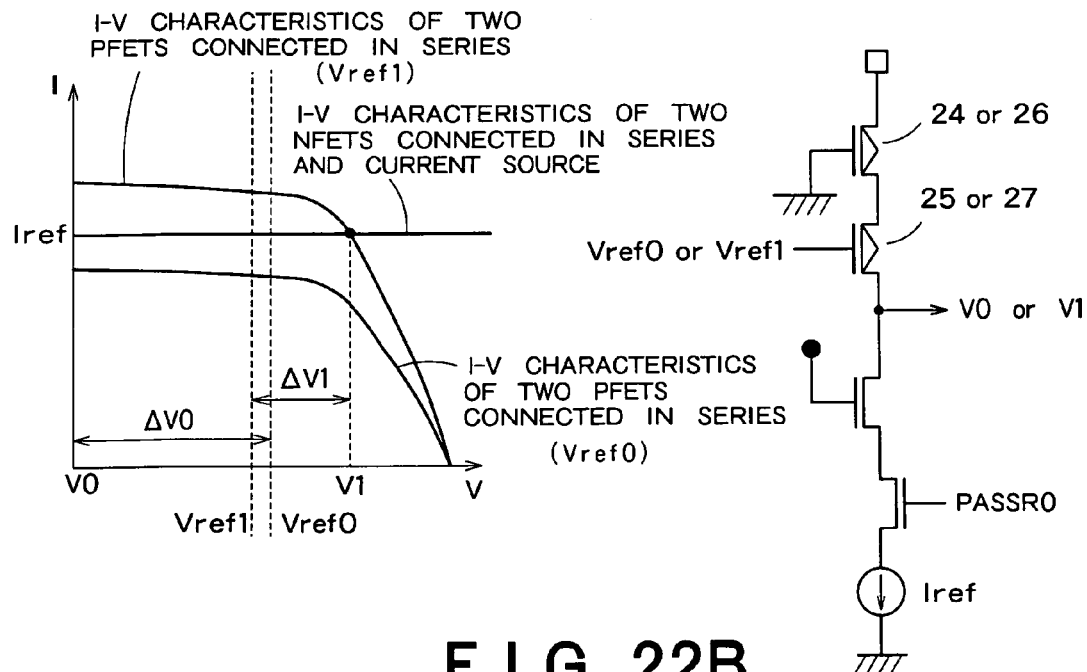

FIGS. 21A and 21B are I-V characteristic diagrams of the circuit shown in FIG. 19. FIGS. 22A and 22B are I-V characteristic diagrams of the circuit shown in FIG. 20. FIGS. 21A and 22B show I-V characteristics of transistors on a current path of the current source Iref side. FIGS. 21B and 22A show I-V characteristics of transistors on a current path of the FBC 3 side.

Regardless of whether "0" is stored in the FBC 3 or "1" is stored in the FBC 3, it is possible in the case of FIG. 21 to design the current load circuit 21 without any special difficulty by always supplying a fixed current from the current source Iref. The I-V characteristics of the circuits shown in FIGS. 17 and 18 also become similar to those shown in FIGS. 21A and 21B.

In the case of the circuit shown in FIG. 20, the reference voltage of the current mirror circuit changes and one of the sense nodes becomes the reference voltage Vref0 or Vref1, depending upon whether "0" is stored or "1" is stored in the FBC 3. Since the current source is connected to the other of the sense nodes, the voltage at the other of the sense nodes becomes V0 or V1. In the case of the circuit shown in FIG. 20, there are no operation points in a plus voltage region and consequently the voltage V0 falls to 0 V as shown in FIG. 22B. Since both signal quantities ΔV0 and ΔV1 can be ensured, however, proper sensing can be conducted.

Thus, even in the case where the connection relation between the current mirror circuit and the current source Iref changes according to the kind of data stored in the FBC 3 as shown in FIGS. 19 and 20, the sense operation seems to be possible. However, it's worth noting that we assumed a constant current source for each sense amplifier in FIG. 22B. In a real situation, this is not the case. The total current for all sense amplifiers in a row is a constant and so all sense amplifiers in the row interact with one another. And, as is the case of the first embodiment, it can be shown that the signal becomes smaller for the case where a minority number of "1"("0") cells are to be read among a majority number of "0"("1") cells. However, if the connection relation between the current mirror circuit and the current source is always the same as shown in FIGS. 17 and 18, however, then it is possible to implement a sense amplifier 1 that conducts more stable sense operation against variation in cells data patterns.

Hereafter, an on-chip generator of the current source Iref shown in FIGS. 17 and 18 will be described. FIG. 23 is a circuit diagram showing an example of the on-chip generator of the current source Iref. The current source Iref shown in FIG. 23 includes a PFET 41, a PFET 42, an NFET 43 and FBCs 44 connected in series between a positive voltage VBLH and a ground voltage VSL, a PFET 45, an NFET 46 and an NFET 47 connected in series between the positive voltage VBLH and the ground voltage VSL in the same way, an NFET 48 which constitutes a current mirror circuit in conjunction with the NFET 46, and an inverter 50 which applies an inverted signal for a signal BLOADON to the gate of the NFET 47. A plurality of FBCs 44 are connected in parallel.

The circuit shown in FIG. 23 has the same basic circuit configuration as that of the circuit shown in FIGS. 17 and 18. In the circuit shown in FIG. 23, however, the element sizes are in proportional relations. In FIG. 23, W0 to W4 represent channel widths and L0 to L4 represent channel lengths. Channel widths/channel lengths of the transistors shown in FIG. 23 differ from each other. The FBC 44 has W0/L0. The PFET 42 has W2×n/L2. The PFET 45 has W2×n×N/L2. The NFET 43 has W3×n/L3. The NFET 46 has W4/L4. The NFET 48 has W4×M/L4.

W4/L4 may have any value as long as it is large enough to be able to flow a current corresponding to a current flew by the PFET having W2×n×N/L2.

The PFETs 42 and 45 shown in FIG. 23 constitute a current mirror circuit. In a current path located on the left side in this current mirror circuit, n FBCs 44 having a threshold value Vth1/2, which is a middle value between Vth0 (threshold voltage of data "0") and Vth1 (threshold voltage of data "1"), and nearly the same dimensions are connected in parallel. Owing to such a circuit configuration, a current corresponding to n dummy cells 5 flows through the left current path in the current mirror circuit.

The current path ranging from the positive voltage VBLH to the ground voltage VSL corresponds to drive of FBCs 44 equivalent to n dummy cells 5, the NMOS transfer gate 43 equivalent to n FET 8, the PMOS current mirror transistor 42 equivalent to n p FET 25 or 27, and the PMOS switch transistor 41 equivalent to n dummy cells 5. The current flowing through this current path is amplified to N times by the current mirror circuit 42 and 45, and then further amplified to M times by the current mirror circuit 46 and 48. As a result, the current in the dummy cell 5 is amplified to n×N×M times. A current corresponding to n×N×M dummy cells flows to a reference voltage terminal VREFCELL as the reference current Iref.

Supposing that n×N×M is the number of the sense amplifiers 1, the current flowing through these sense amplifiers 1 is drawn from the reference voltage terminal VREFCELL. As a result, a dummy cell 5 current required for n×N×M sense amplifiers 1 is supplied. Therefore, proper sensing can be conducted.

Figure 24:
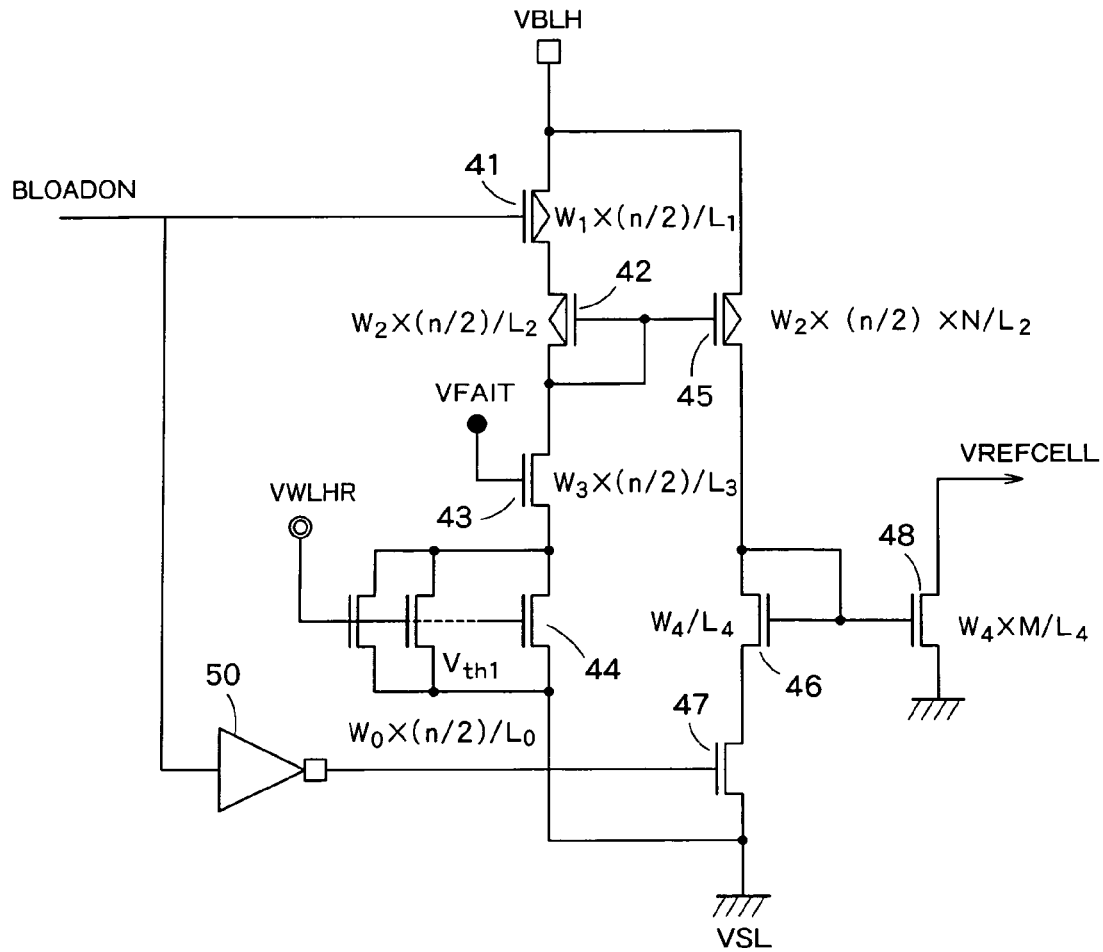
FIG. 24 is a circuit diagram showing a first variant of the current source Iref.

FIG. 24 is a circuit diagram showing a first variant of the current source Iref. The current source Iref shown in FIG. 24 differs from the current source Iref shown in FIG. 23 in that the magnification of the transistors 41 to 45 is half of the counterparts in FIG. 23. A current that is equal to (n/2)×N×M times the cell current I1 of data "1" having a threshold Vth1 flows as the reference current. If the cell current of data "0" is approximately 0, Iref=(n/2)×N×M×I1 corresponds to the sum of currents of the dummy cells 5.

FIG. 25 is a circuit diagram showing a second variant of the current source Iref. In the current source Iref shown in FIG. 25, the channel length L and the channel width W of the transistors 41-44 are made larger as compared with FIGS. 23 and 24. A suitable reference current Iref can be supplied by adjusting the body voltage of these transistors. The body potential VCB is generated by a generation circuit within a chip in some cases or applied from the outside.

Each of the current sources Iref in FIGS. 23 to 25 includes two current mirror circuits. Even if even-numbered pairs of current mirror circuits are provided, however, similar effects are obtained.

Thus, in the second embodiment, data stored in the FBC 3 is sensed by using the reference voltage VREFCELL without using the dummy cells 5. Resultant effects diverse. As representative effects, the following effects (1) to (5) are obtained.

(1) Since the dummy cells 5 become unnecessary, the cell area can be reduced.

(2) Since the dummy word lines become unnecessary, the circuit scale of the row decoders and the word line drive circuits can be reduced.

(3) Since the write operation for the dummy cells 5 becomes unnecessary, the operation frequency of the semiconductor storage apparatus can be increased.

(4) Since the write operation for the dummy cells 5 becomes unnecessary, the power consumption can be reduced.

(5) Since the write circuits for the dummy cells 5 become unnecessary, the size of the semiconductor storage apparatus can be reduced.

Other Embodiments

The dynamic latch circuit 22 and 23 in the sense amplifier 1 shown in FIG. 3 is applied with the signals BSAN and SAP. Instead, the voltage VBLL and VBLH may be supplied to the dynamic latch circuit 22 via transistors 51 and 52. In this case, the circuit diagram around the sense amplifier 1 becomes as shown in FIG. 26, and the internal configuration of the sense amplifier 1 becomes as shown in FIG. 27.

Figure 26:
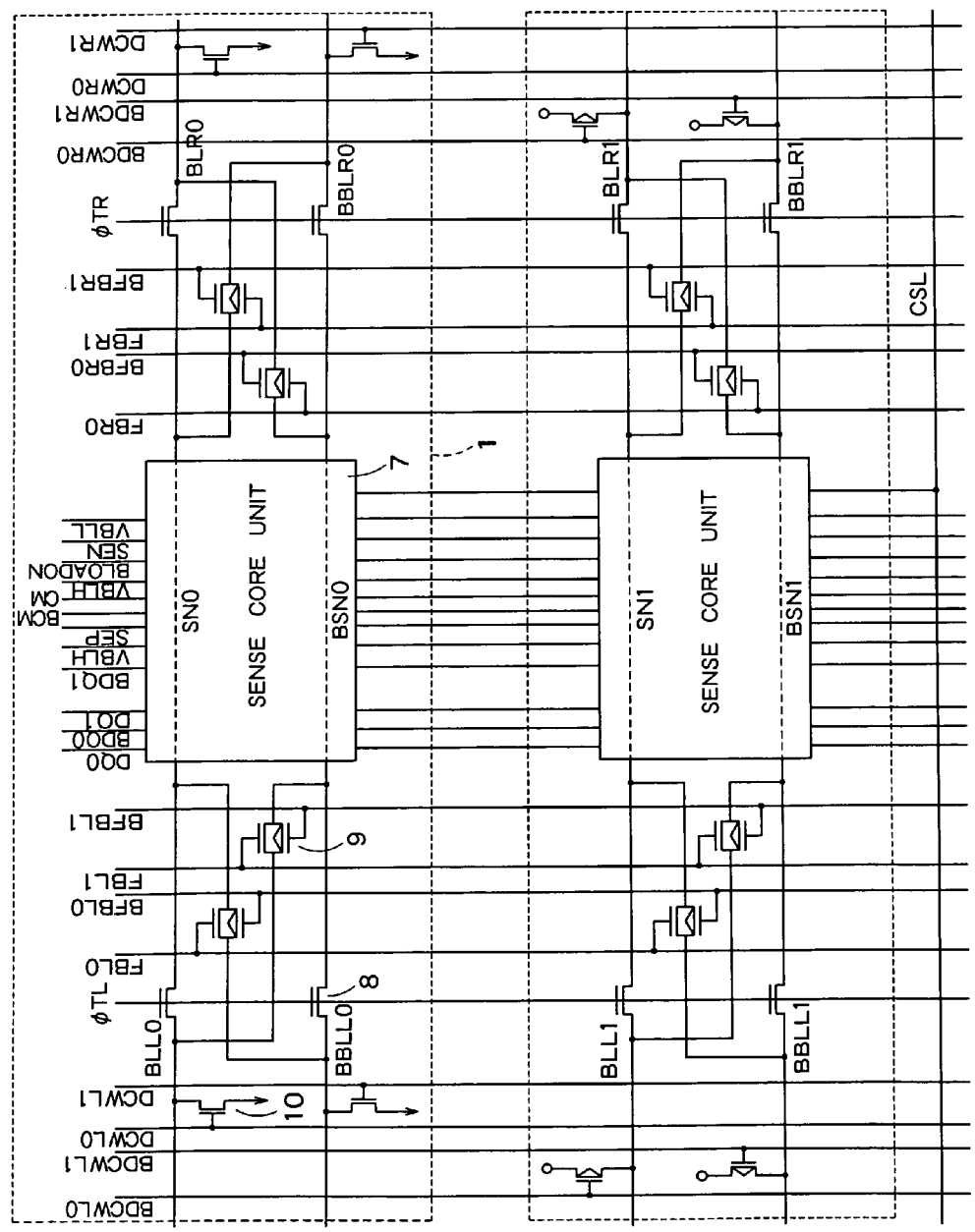
FIG. 26 is a circuit diagram surrounding the sense amplifier in the case of supplying the power supply voltages via the transistors.

In FIG. 26, the kinds of signals input to the sense amplifier 1 differ from those shown in FIG. 2. Instead of the signals BSAN and SAP, signals SEN, VBLL, SEP and VBLH are input.

Figure 27:
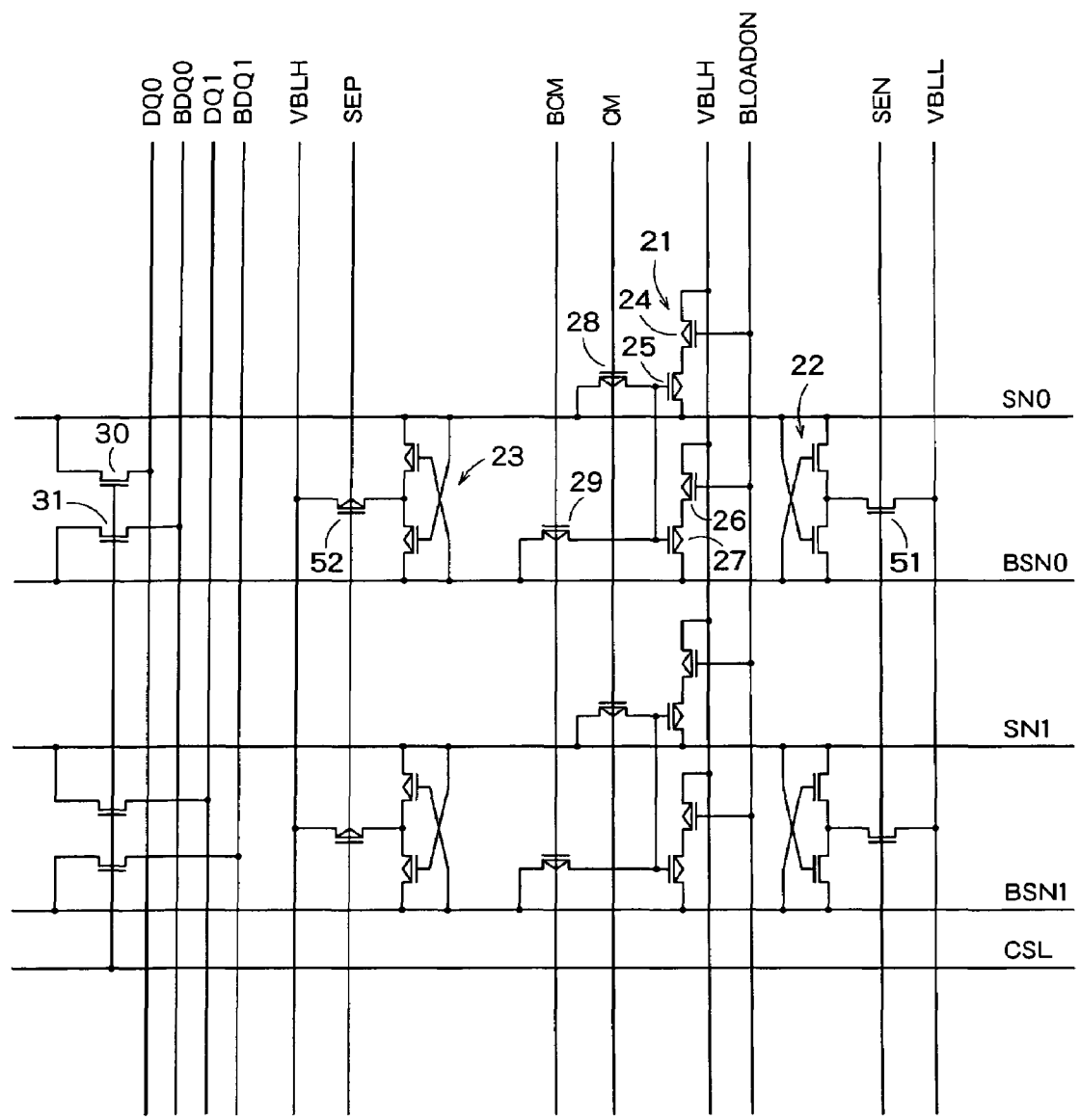
FIG. 27 is a circuit diagram showing internal configuration of the sense amplifier corresponding to FIG. 26.

The circuit shown in FIG. 27 is the same as the circuit shown in FIG. 3 except that the transistors 51 and 52 turned on and off by the signals SEN and SEP, and voltages VBLL and VBLH connected to these transistors are newly added.

In the same way, the sense amplifier 1 in the circuit shown in FIG. 14 can be changed to a circuit similar to that shown in FIG. 27. In that case, the circuit diagram becomes as shown in FIG. 28.

What is claimed is:

1. A semiconductor storage apparatus, comprising:
    a pair of first and second bit lines;
    a cell array having a plurality of memory cells connected to the first or second bit line;
    a sense amplifier which is provided corresponding to a pair of first and second bit lines and senses data read out from the memory cell,
    wherein the sense amplifier includes a current mirror circuit having first and second current paths connected directly or indirectly to the pair of first and second bit lines; and
    the current mirror circuit includes:
    a first transistor which has a source, a gate, and a drain short-circuited to the gate and flows a reference current between the source and the drain thereof; and
    a second transistor, of which gate is connected to the gate of the first transistor, and which flows a current passing through the memory cell to be read out between a source and a drain thereof.

2. The semiconductor storage apparatus according to claim 1, further comprising reference cells, which are selected by reference word lines, respectively, and have the same size, shape and electrical properties as those of the memory cells having a prescribed value in advance,
    wherein the reference current is generated by the reference cells.

3. The semiconductor storage apparatus according to claim 2, wherein the reference cells store data having an intermediate potential between data "1" and "0" stored in the memory cells.

4. The semiconductor storage apparatus according to claim 2, wherein each of the reference cells is provided corresponding to the pair of first and second bit lines;
    the reference cell connected to the first bit lines and the reference cell connected to the second bit line are controlled selectively by the reference word lines different from each other.

5. The semiconductor storage apparatus according to claim 1, wherein the first bit line is provided with the memory cells connected to odd-numbered word lines;
    the second bit line is provided with the memory cells connected to even-numbered word lines; and
    the different dummy cells are selected depending on whether the memory cell connected to the even-numbered word lines is selected or the memory cell connected to the odd-numbered lines is selected.

6. The semiconductor storage apparatus according to claim 1, further comprising a reference current source which generates a constant current in proportion with the current flowing through the memory cells,
    wherein the reference current is generated by the reference current source.

7. The semiconductor storage apparatus according to claim 6, wherein the reference current source has the same circuit configurations as those of the memory cells and the sense amplifiers, and is formed by using elements having element sizes in proportion with those in the sense amplifier.

8. The semiconductor storage apparatus according to claim 7, wherein the reference current source is formed by using elements having element sizes in accordance with the number of the sense amplifier.

9. The semiconductor storage apparatus according to claim 6, further comprising:
    a constant current control transistor which is provided corresponding to the pair of first and second bit lines, respectively, and controls whether the constant current is supplied from the reference current source to the corresponding first or second bit line.

10. The semiconductor storage apparatus according to claim 1, further comprising:
    a pair of sense nodes provided corresponding to the first and second bit lines;
    a dynamic latch circuit which latches a potential of the pair of sense nodes when a potential difference between the pair of sense nodes reaches a prescribed value; and
    an output control circuit which outputs the potential latched by the dynamic latch circuit at a prescribed timing and feedbacks the output on the first and second bit lines to rewrite it in the read-out memory cell.

11. The semiconductor storage apparatus according to claim 1, wherein the sense amplifiers are arranged between the neighboring two cell arrays.

12. The semiconductor storage apparatus according to claim 1, wherein the memory cells are FBC (Floating Body Cells).

13. A semiconductor storage apparatus, comprising:
    a pair of first and second bit lines;
    a cell array having a plurality of memory cells connected to the first or second bit line;
    a sense amplifier which is provided corresponding to a pair of first and second bit lines and senses data read out from the memory cell,
    wherein the sense amplifier includes a current mirror circuit having first and second current paths connected directly or indirectly to the pair of first and second bit lines; and
    the current mirror circuit includes:
    a first and a second transistors which are connected directly or indirectly to the pair of first and second bit lines, and of which gates are connected to each other;
    a third transistor which controls whether the gate and a drain of the first transistor are short-circuited; and
    a fourth transistor which controls whether the gate and a drain of the second transistor are short-circuited,
    said first or second transistor having the gate and the drain short-circuited to each other and flowing a reference current between a source and the drain, and the other flowing a current passing through the memory cell to be read out between a source and the drain, based on whether the third and fourth transistors is ON or OFF.

14. The semiconductor storage apparatus according to claim 13, wherein the third and fourth transistors control turning on or off based on a current mirror control signal; and
    a logic level of the current mirror control signal changes based on logic levels of the word lines for controlling selection of the memory cells and logic levels of dummy word lines for controlling selection of the reference cells.

* * * * *